(12) United States Patent
Kitamura et al.

(10) Patent No.: US 10,700,167 B2
(45) Date of Patent: Jun. 30, 2020

(54) SEMICONDUCTOR DEVICE HAVING AN OHMIC ELECTRODE INCLUDING A NICKEL SILICIDE LAYER

(71) Applicant: FUJI ELECTRIC CO., LTD., Kawasaki-shi, Kanagawa (JP)

(72) Inventors: Shoji Kitamura, Matsumoto (JP); Tsukasa Tashima, Matsumoto (JP); Kazuhiro Kitahara, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/796,913

(22) Filed: Oct. 30, 2017

(65) Prior Publication Data
US 2018/0158914 A1 Jun. 7, 2018

(30) Foreign Application Priority Data
Dec. 7, 2016 (JP) .................................. 2016-238019

(51) Int. Cl.
*H01L 29/16* (2006.01)
*H01L 29/06* (2006.01)
(Continued)

(52) U.S. Cl.
CPC .... *H01L 29/1608* (2013.01); *H01L 21/02378* (2013.01); *H01L 21/02529* (2013.01);
(Continued)

(58) Field of Classification Search
CPC .. H01L 29/1608; H01L 21/0485; H01L 29/45
See application file for complete search history.

(56) References Cited

U.S. PATENT DOCUMENTS

2009/0102598 A1* 4/2009 Yamazaki ............... H01L 45/04
338/20
2009/0250705 A1 10/2009 Watanabe et al.
(Continued)

FOREIGN PATENT DOCUMENTS

JP 2005-277240 A 10/2005
JP 2007-324187 A 12/2007
(Continued)

OTHER PUBLICATIONS

Akira Suzuki, "Contact Material for SiC Semiconductor", Materia Japan, vol. 33, No. 6, pp. 725-731, 1994; English translation of the relevant part: p. 726, line 13 to p. 727, line 14.
(Continued)

*Primary Examiner* — Lex H Malsawma
*Assistant Examiner* — Laura M Dykes
(74) *Attorney, Agent, or Firm* — Rabin & Berdo, P.C.

(57) ABSTRACT

A semiconductor device includes a first semiconductor layer of a first conductivity type provided on a front surface of a silicon carbide semiconductor substrate of the first conductivity type, a first semiconductor region of a second conductivity type, a second semiconductor region of the second conductivity type and connected to the first semiconductor region, a first electrode forming a Schottky-contact with the first semiconductor layer and the first semiconductor region, and a second electrode forming an ohmic contact with the second semiconductor region. The second electrode has a Ti—Al alloy layer on a surface in contact with the first electrode. The second electrode further has therein a nickel silicide layer containing titanium.

5 Claims, 17 Drawing Sheets

(51) Int. Cl.
    *H01L 29/872* (2006.01)
    *H01L 29/45* (2006.01)
    *H01L 29/47* (2006.01)
    *H01L 21/02* (2006.01)
    *H01L 21/04* (2006.01)
    *H01L 29/66* (2006.01)

(52) U.S. Cl.
    CPC .. *H01L 21/02634* (2013.01); *H01L 21/02636* (2013.01); *H01L 21/0485* (2013.01); *H01L 21/0495* (2013.01); *H01L 29/0619* (2013.01); *H01L 29/0684* (2013.01); *H01L 29/0692* (2013.01); *H01L 29/45* (2013.01); *H01L 29/47* (2013.01); *H01L 29/6606* (2013.01); *H01L 29/872* (2013.01); *H01L 29/0615* (2013.01)

(56) References Cited

U.S. PATENT DOCUMENTS

| | | | |
|---|---|---|---|
| 2011/0198617 A1 | 8/2011 | Iwanaga et al. | |
| 2011/0233560 A1* | 9/2011 | Koike | H01L 21/0485 257/77 |
| 2012/0007104 A1 | 1/2012 | Wada et al. | |
| 2013/0341647 A1 | 12/2013 | Yamada et al. | |
| 2015/0091022 A1* | 4/2015 | Kawaguchi | H01L 29/872 257/77 |

FOREIGN PATENT DOCUMENTS

| | | |
|---|---|---|
| JP | 4935741 B2 | 5/2012 |
| WO | WO-2010/047222 A1 | 4/2010 |
| WO | WO-2010/134415 A1 | 11/2010 |
| WO | WO-2011/099338 A1 | 8/2011 |
| WO | WO-2013/190907 A1 | 12/2013 |

OTHER PUBLICATIONS

S. K. Lee et al., "Schottky Barrier Height Dependence on the Metal Work Function for p-type 4H-Silicon Carbide", Journal of Electronic Materials, vol. 30, No. 3, pp. 242-246, 2001.

Ito Kazuhiro et al., "Effects of Reducing Annealing Temperature on Ni/Al Ohmic Contacts to n- and p-Type 4H-SiC", Transactions of JWRI, vol. 41, No. 2, pp. 33-38, 2012.

T. Watanabe et al., "Effects of Implantation Temperature on sheet and contact resistance of heavily Al implanted 4H-SiC", Materials Science Forum, vols. 645-648, pp. 705-708, 2010.

I. P. Nikitina et al., "Formation and role of graphite and nickel silicide in nickel based ohmic contacts to n-type silicon carbide", Journal of Applied Physics 97, 083709, pp. 083709-1-083709-7, 2005.

* cited by examiner

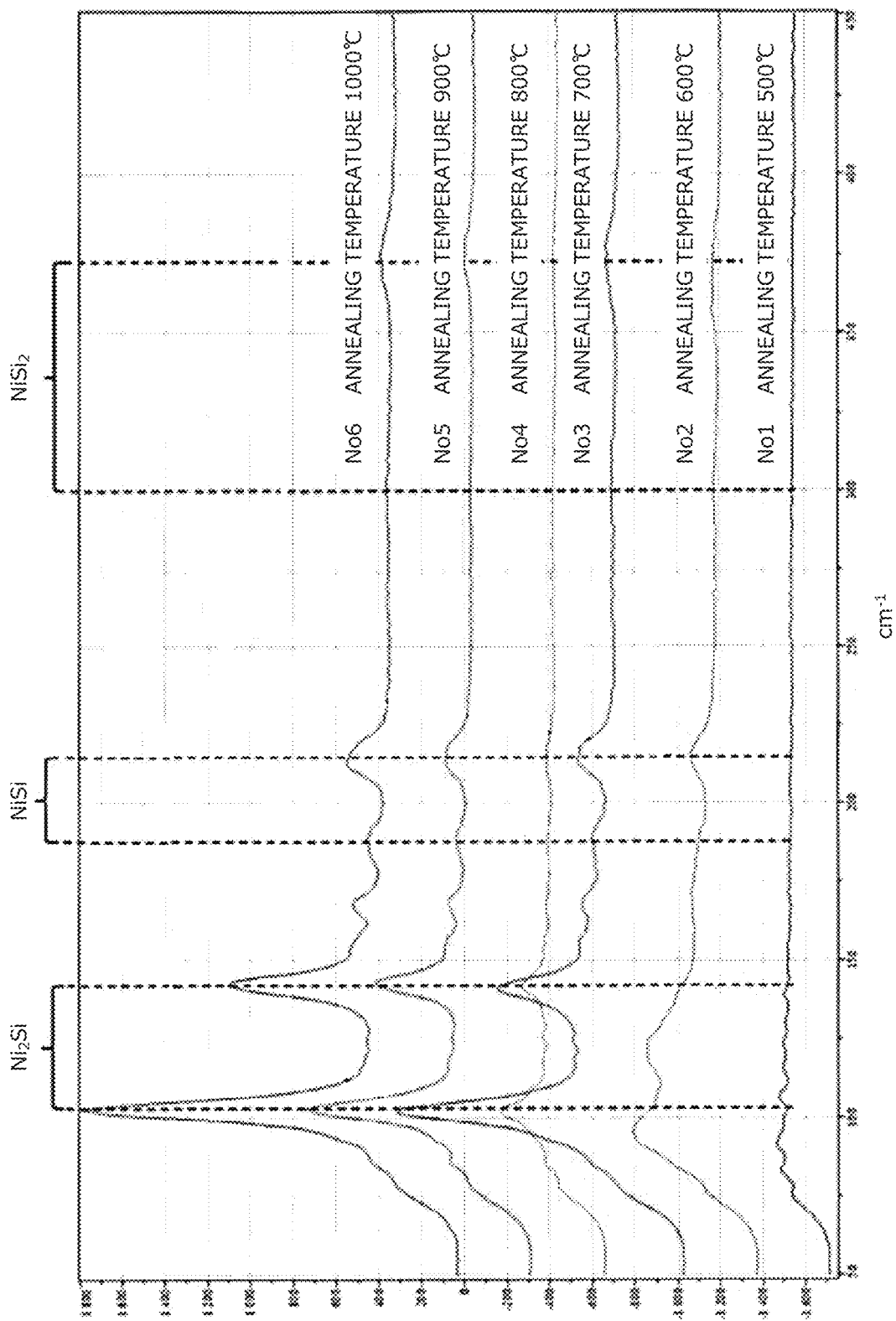

SEMICONDUCTOR DEVICE HAVING AN OHMIC ELECTRODE INCLUDING A NICKEL SILICIDE LAYER

CROSS REFERENCE TO RELATED APPLICATIONS

This application is based upon and claims the benefit of priority of the prior Japanese Patent Application No. 2016-238019, filed on Dec. 7, 2016, the entire contents of which are incorporated herein by reference.

BACKGROUND OF THE INVENTION

1. Field of the Invention

Embodiments of the present invention relate to a semiconductor device and a method of manufacturing a semiconductor device.

2. Description of the Related Art

Recently, semiconductor devices using a silicon carbide (SiC) semiconductor material (hereinafter, silicon carbide semiconductor devices) have been attracting attention as elements that exceed the limitations of semiconductor devices that use a silicon (Si) semiconductor material. In particular, compared to a silicon semiconductor, a silicon carbide semiconductor has high critical electric field strength and is expected to be applied to high-voltage elements by taking advantage of its attribute of high thermal conductivity. SiC enables a thinner epitaxial film and a higher concentration than those achieved with Si. As a result, SiC is often applied to high voltage Schottky barrier diodes (SBDs) and low ON-resistance metal oxide semiconductor field effect transistors (MOSFETs).

For voltages up to about 3300 V, SBD structures are prevalent as diode structures using SiC. FIG. 16 is a cross-sectional view along cutting line A-A' in FIG. 17, which depicts the structure of a conventional silicon carbide diode. The silicon carbide diode includes an n-type silicon carbide substrate 101, a Schottky electrode 109 that forms a Schottky-junction with the n-type silicon carbide substrate 101, and an upper electrode 1010. FIG. 17 is a top view of the structure of the conventional silicon carbide diode. The silicon carbide diode includes an active region 1020 in which an element structure is formed and through which current flows during an ON-state, and an edge termination region 1030 that mitigates the electric field on a front surface side of a base substrate in a drift region.

In an ordinary SBD structure, the electric field strength of the surface of the SBD is high and a problem of increases in reverse current occurs, attributed to reverse current caused by tunneling or surface defects particular to SiC. As a result, a diode has been proposed that employs a junction barrier Schottky (JBS) structure having both a Schottky junction and a pn-junction. FIG. 18 is a cross-sectional view along cutting line A-A' in FIG. 19, which depicts the structure of a silicon carbide diode having a conventional JBS structure. FIG. 19 is a top view of the structure of the silicon carbide diode having a conventional JBS structure. As depicted in FIG. 18, a p-type well region 103 to form the JBS structure is provided and the p-type well region 103 forms a junction with the Schottky electrode 109 in a region S. The surface electric field strength may be reduced and reverse current substantially equal to that of a Si freewheeling diode (FWD) may be achieved by employing the JBS structure.

As for forward surge current, although the silicon carbide diode having the JBS structure depicted in FIG. 18 is an improvement over a silicon carbide diode having the ordinary SBD structure, values of the former are often significantly lower than the values required for practical use. The values required for practical use differ according to application.

In general, in a silicon carbide diode having the ordinary SBD structure, the resistance is high in a high current region due to unipolar operation of the Schottky junction portion, and the Schottky junction and an n-type SiC layer immediately beneath the Schottky junction are destroyed due to local current concentration resulting from surface heat generation. It is presumed that by employing a JBS structure like that depicted in FIG. 18, forward surge current increases due a phenomenon of the rise of current resulting from bipolar operation of a PN-portion. Although an increase of the forward surge current is recognized for the JBS structure of Si, this effect does not conspicuously appear with SiC. One factor for this is insufficient ohmic contact in the region S depicted in FIG. 18 with a p-type SiC portion (the p-type well region 103) formed by ion implantation of a p-type impurity such as aluminum (Al) and a high-temperature heat treatment of the JBS structure.

Thus, it is conceivable that formation using an electrode material that will improve ohmic characteristics with respect to the p-type SiC portion will cause, in the high current operation region, current to locally flow through the pn-junction portion of the JBS structure unit and improve the forward surge current.

With a structure like that depicted in FIG. 18, the p-type well region 103 contacts the Schottky electrode 109 in the region S. The Schottky electrode 109 is usually formed using a titanium (Ti) or a nickel (Ni) electrode heat treated at about 500 degrees C. and it is presumed for this method that no ohmic junction is obtained between the p-type well region 103 and the Schottky electrode 109. Although a Schottky junction and an ohmic junction may be actually realized using the same material, it is difficult to stably produce these junctions in terms of material selection and processing conditions. As a result, a technique is often used in which ohmic contact regions are provided by using in at least several locations in the p-type well region 103 in the active region, electrodes that differ from the Schottky electrode. For example, FIG. 20 is a cross-sectional view of the structure of a silicon carbide diode having a conventional Ni contact electrode. As depicted in FIG. 20, several locations in the p-type well region 103 are set to have an area enabling formation of the contact region and an ohmic electrode 108 having an ohmic junction is formed therein. The ohmic electrode 108 is often formed by heat treating the electrode material such as Ni or AlNi at a high temperature of about 1000 degrees. However, the mechanism of the ohmic junction formation in the p-type SiC portion is not clear at present.

When the ohmic junction is formed in the p-type well region 103 of the JBS structure as above, to improve the ohmic property for the p-type well region 103 and to form on the ohmic electrode 108, the Schottky electrode 109 and the upper electrode 1010 for the assembly, the ohmic electrode 108 has to maintain excellent adhesiveness with these electrodes.

Conventionally, an Al film is heat treated at about 1000 degrees C. for the formation of ohmic material in the p-type SiC portion. However, Al does not form a silicide layer, and uniformity and stability are not sufficient after the heat treatment, making this technique unsuitable for practical use (see, e.g., Akira Suzuki, "Contact Material for SiC Semiconductor", Material, Vol. 33, No. 6 (1994), pp. 725-731). As a result, attempts have been made to impart the ohmic property by heat treatment at a high temperature using a material that forms a silicide layer with SiC such as Ti or Ni.

For example, a work function of a Schottky barrier for p-type SiC has been measured to be 1.96 eV for practical Ti and 1.42 eV for Ni (see, e.g., S. K. LEE, et al, "Schottky Barrier Height Dependence on the Metal Work Function for p-Type 4H-Silicon Carbide", Journal of ELECTRONIC MATERIALS, Vol. 30, No. 3, 2001, pp. 242-246). Therefore, Ni is considered promising as the material for the ohmic contact.

According to another technique, an Ni layer and an Al layer are formed and heat treated to form Al-added $Ni_2Si$ and thereby, reduce the temperature of the heat treatment to about 900 degrees C. (see, e.g., I. Kazuhiro, et al, "Effects of Reducing Annealing Temperature on Ni/Al Ohmic Contacts to n- and p-type 4H—SiC", Transactions of JWRI, Vol. 41 (2012), No. 2, pp. 33-38). A technique of improving the ohmic property by minimizing the ion implantation temperature (175 degrees C. to 250 degrees C.) for Al is present (see, e.g., T. Watanabe, et al, "Effects of Implantation Temperature on Sheet and Contact Resistance of Heavily Al Implanted 4H—SiC", Materials Science Forum, Vols. 645-648 (2010), pp. 705-708). Other literature describes that, for n-type SiC, the reason that the ohmic property is improved by high-temperature heat treatment for Ni silicide is the electric conduction contributed by the level created by carbon (C) vacancies formed by Ni silicide formation (see, e.g., I. P. Nikitina, et al, "Formation and Role of Graphite and Nickel Silicide in Nickel Based Ohmic Contacts to n-Type Silicon Carbide", Journal of Applied Physics 97, 083709 (2005), p. 97). As described, although improvement of the ohmic property by optimizing the temperature of the high-temperature heat treatment and the ion implantation on the basis of the Ni silicide structure, etc. has been reported, in actually, the ohmic mechanism has not been determined.

According to a technique of forming an ohmic electrode by simultaneously forming electrodes in an n-type SiC and a p-type SiC, Si, Al, and Ti are sequentially deposited and heat treated to form a Ti—Si region and an Al region as islands whereby the p-type SiC forms an ohmic contact in the Al region (see, e.g., Published Japanese-Translation of PCT Application, Publication No. 2013-190907). According to another technique, a Ti—Ni—Mo (molybdenum) electrode is formed as an electrode of the JBS structure and heat treated at a temperature in a range from 500 degrees C. to 900 degrees C. to ensure the ohmic property for a p-type SiC using a Ti—Ni alloy, and a Schottky junction is formed using Mo (see, e.g., Published Japanese-Translation of PCT Application, Publication No. 2011-099338).

In another technique, Ni, Ti, and Al are stacked in this order on p-type SiC and the element ratios, film thicknesses, the heat treatment temperatures are defined (see, e.g., Published Japanese-Translation of PCT Application, Publication No. 2010-047222). According to another technique of forming Ni, Ti, and Al films in this order to form an ohmic electrode in both n-type and p-type SiC (see, e.g., Japanese Laid-Open Patent Publication No. 2005-277240). According to a technique of uniformly forming a Ni silicide on n-type Si, Al is deposited on Si and an Ni film is thereafter formed to establish a structure in which Al is distributed on the Ni film surface (see, e.g., Japanese Laid-Open Patent Publication No. 2007-324187). According to another technique, high-concentration Al ion implantation is executed at a temperature of 175 degrees C. to 200 degrees C. and after activation, a Ni ohmic contact is formed (see, e.g., Japanese Patent Publication No. 4935741). According to another technique, to form an ohmic electrode for both the n-type and the p-type, Ti, Ni, and Si are stacked in this order on SiC and heat treated thereafter (see, e.g., Published Japanese-Translation of PCT Application, Publication No. 2010-134415).

SUMMARY OF THE INVENTION

According to one embodiment of the present invention, a semiconductor device includes a silicon carbide semiconductor substrate of a first conductivity type; a first semiconductor layer of the first conductivity type provided on a front surface of the silicon carbide semiconductor substrate; a first semiconductor region of a second conductivity type selectively provided in a surface of the first semiconductor layer; a second semiconductor region of the second conductivity type selectively provided in the surface of the first semiconductor layer, the second semiconductor region being connected to the first semiconductor region; a first electrode forming a Schottky-contact with the first semiconductor layer and the first semiconductor region; and a second electrode forming an ohmic contact with the second semiconductor region. The second electrode includes a titanium-aluminum alloy provided on a surface contacting the first electrode, and the second electrode further having therein a nickel silicide layer containing titanium.

In the embodiment, the second electrode includes carbon provided at a same position as that of the titanium in the nickel silicide layer.

In the embodiment, a main constituent of the nickel silicide layer is $Ni_2Si$.

According to another embodiment of the present invention, a method of manufacturing a semiconductor device includes preparing a silicon carbide semiconductor substrate of a first conductivity type; forming a first semiconductor layer of the first conductivity type on a front surface of the silicon carbide semiconductor substrate; selectively forming a first semiconductor region of a second conductivity type on a surface of the first semiconductor layer; selectively forming a second semiconductor region of the second conductivity type on the surface of the first semiconductor layer, the second semiconductor region being connected to the first semiconductor region; forming a first electrode, the first electrode forming a Schottky-contact with the first semiconductor layer and the first semiconductor region; and forming a second electrode, the second electrode forming an ohmic-contact with the second semiconductor region. Formation of the second electrode includes depositing aluminum, nickel, and titanium in this order and heat treating the deposited aluminum, nickel, and titanium.

In the embodiment, the heat treating is executed at 900 degrees C. to 1100 degrees C.

In the embodiment, the aluminum is deposited to have a thickness of 10 to 20 nm, the nickel is deposited to have a thickness of 30 to 90 nm, and the titanium is deposited to have a thickness of 30 to 60 nm.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 25 is a graph of Raman spectroscopy spectra obtained when the heat treatment temperature is 500 degrees C. to 1000 degrees C.

DETAILED DESCRIPTION OF THE INVENTION

As described above, according to an existing technique, Ni silicide is used as an ohmic contact material for p-type SiC and heat treatment is performed at about 1000 degrees C. When a single layer of Ni is used, a problem arises in that the manufactured device is unsuitable for practical use because the contact layer becomes non-uniform due to an agglomeration effect of Ni occurring when silicide is formed with Ni, and an increase of the operation resistance and degradation of the adhesiveness of the upper electrode (peeling off) become significant as a result of excess deposition of C occurring in the formation of a silicide with SiC, on the surface of the single layer of Ni.

In the technique of adding Al or Ti to Ni to alloy at a high temperature, a structure in which Ni, Ti, and Al are stacked in this order is present and, in this case, variation often occurs in the Ni silicide formation and the furnace may be contaminated by Al scattering in the furnace during the alloy heat treatment.

Therefore, formation of a low-resistance ohmic layer on a Ni silicide having a small work function as the base, and a stable ohmic electrode that is for a p-type SiC, has excellent adhesiveness with the upper electrode, and does not contaminate the device during the processing, etc. are demanded.

Figure 20:
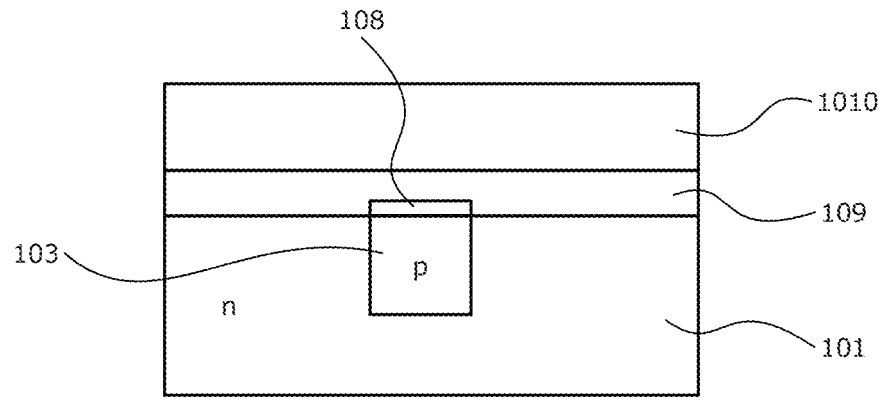
FIG. 20 is a cross-sectional view of the structure of a silicon carbide diode having a conventional Ni contact electrode.

For example, conventionally, provision of an Ni contact electrode as in FIG. 20 has been proposed. As depicted in FIG. 20, an Ni layer is formed as the ohmic electrode 108 in the p-type well region 103, heat treatment is performed at 1200 degrees C., a Ti layer is thereafter formed as the Schottky electrode 109, heat treatment is performed at 500 degrees C., and an Al layer is thereafter formed as the upper electrode 1010.

Figure 18:
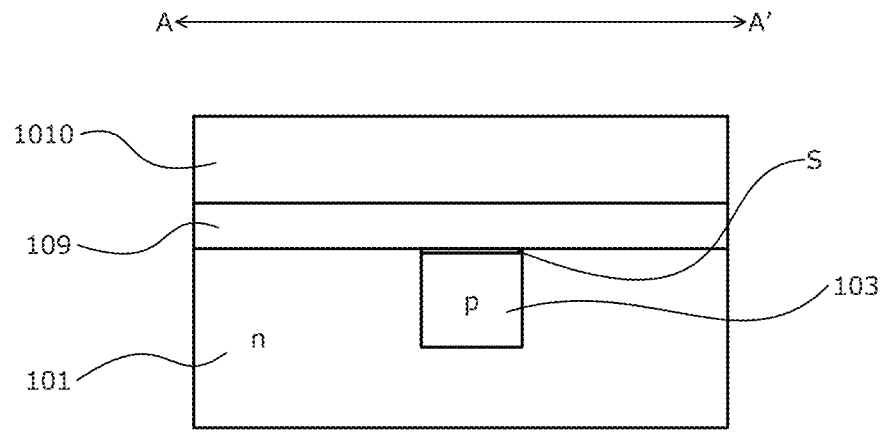
FIG. 18 is a cross-sectional view along cutting line A-A' in FIG. 19.
Figure 19:
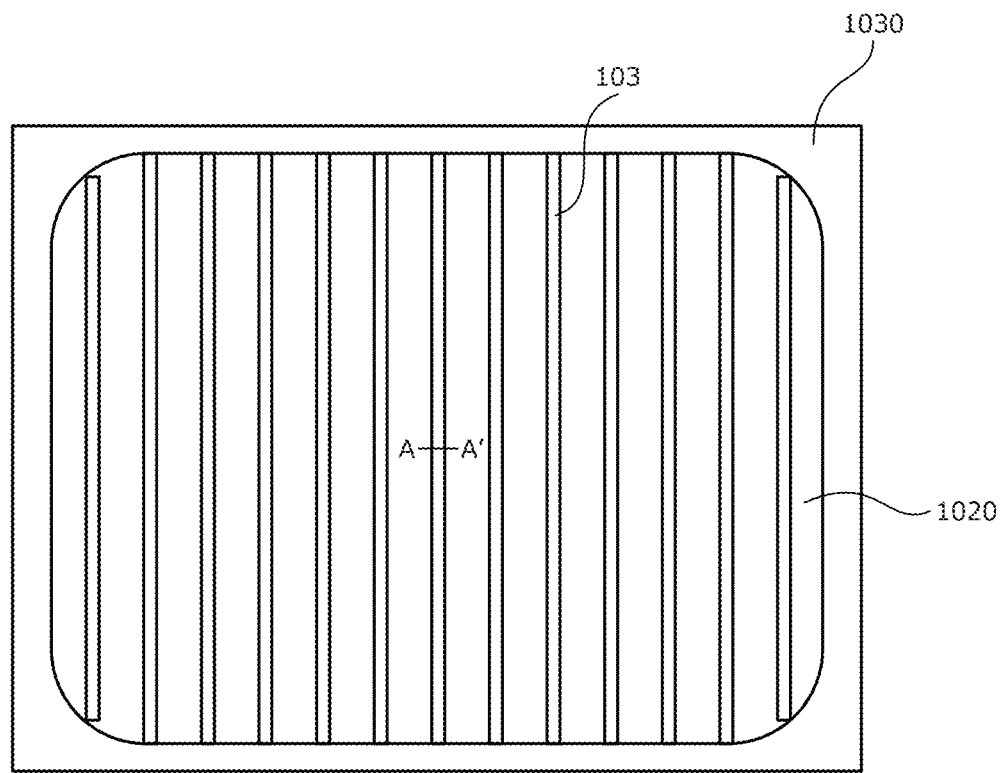
FIG. 19 is a top view of the structure of a silicon carbide diode having a conventional JBS structure.
Figure 21:
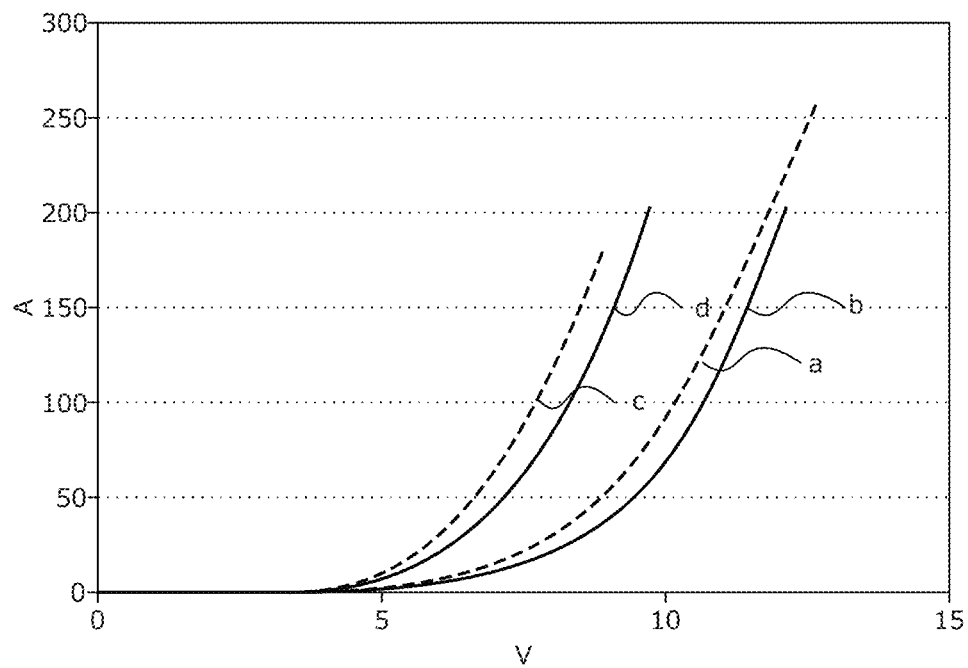
FIG. 21 is a graph of a comparison of the forward property between conventional silicon carbide diodes.

FIG. 21 is a graph of a comparison of the forward property between the conventional silicon carbide diodes. In FIG. 21, the horizontal axis represents the voltage and the unit thereof is "V", and the vertical axis represents the current and the unit thereof is "A". The results of measurement executed at 150 degrees C. and the room temperature (RT) are depicted. For solid lines and dotted lines in FIG. 21, the lines denoted by reference letters "a" and "b" each represents the forward property of the silicon carbide diode in FIG. 20 that includes the Ni contact electrode and the lines denoted by reference letters "c" and "d" each represents the forward property of the silicon carbide diode in FIG. 18 that includes no Ni contact electrode. The results of measurement executed at 150 degrees C. and the room temperature (RT) are depicted. In FIG. 21, the lines denoted by the reference letters "b" and "d" represent the results obtained at the room temperature, and the lines denoted by the reference letters "a" and "c" represent the results obtained at 150 degrees C. As depicted in FIG. 21, results for the silicon carbide diode including the Ni contact electrode (denoted by the reference letter "b") indicate that this diode had a degraded ohmic property and high resistance.

Figure 22:
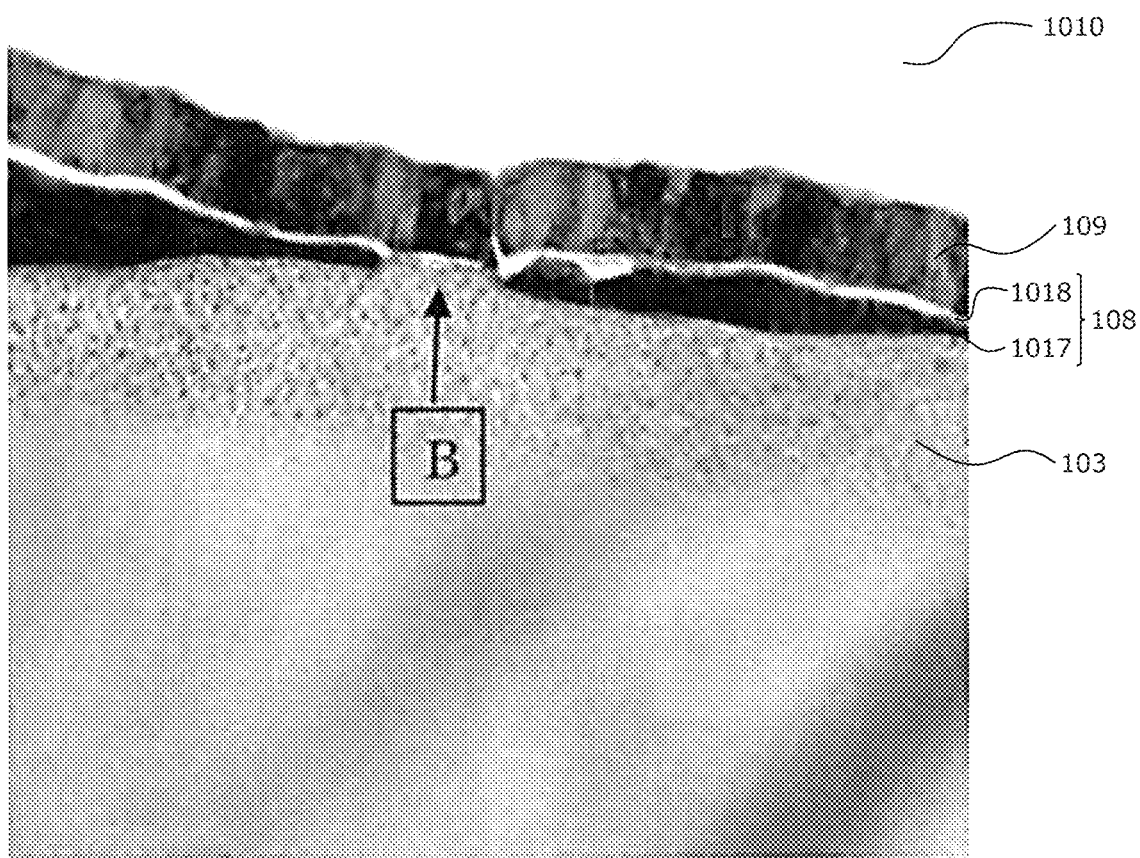
FIG. 22 is a cross-sectional view of the structure of an ohmic electrode of a conventional silicon carbide diode.

FIG. 22 is a cross-sectional view of the structure of the ohmic electrode of the conventional silicon carbide diode. FIG. 22 depicts an observation result of a cross-section of the structure of the silicon carbide diode in FIG. 20. As depicted in FIG. 22, in the ohmic electrode 108, although the $Ni_2Si$ layer 1017 was formed, the $Ni_2Si$ layer 1017 was non-uniform and as denoted by a reference letter "B" in FIG. 22, SiC and $Ni_2Si$ did not contact each other at some portions. It is presumed that this is because the $Ni_2Si$ layer 1017 agglomerated in the high-temperature heat treatment.

A C layer 1018 was formed on the surface of the $Ni_2Si$ layer 1017. Although this C precipitated associated with the formation of the silicide of SiC, because this C precipitated on the surface of the $Ni_2Si$ layer 1017, the adhesiveness of the surface of the $Ni_2Si$ layer 1017 degraded for Ti of the Schottky electrode 109 thereon and the C layer 1018 is a factor for the increased resistance depicted in FIG. 21.

Figure 23:
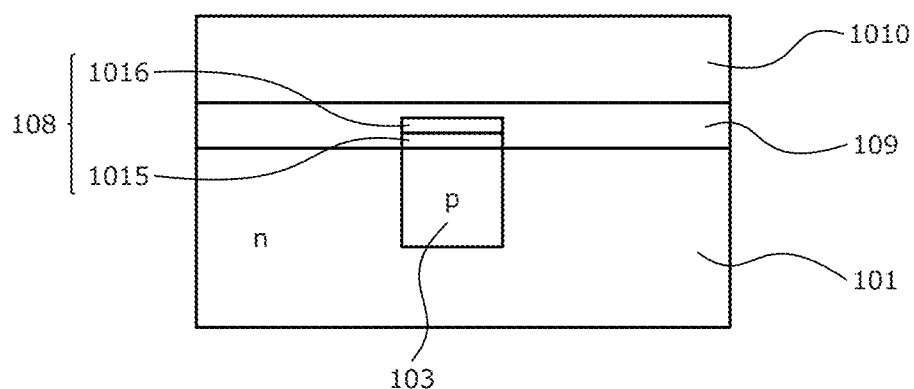
FIG. 23 is a cross-sectional view of the structure of a silicon carbide diode that includes a conventional two-layer contact electrode.

To solve this defect, a two-layer contact electrode including an Al layer and an Ni layer has been proposed (see, e.g., Japanese Laid-Open Patent Publication No. 2007-324187). This is a technique used for a Si semiconductor. FIG. 23 is a cross-sectional view of the structure of a silicon carbide diode that includes a conventional two-layer contact electrode. As depicted in FIG. 23, an Al layer 1015 is formed to have a thickness of 10 nm in the p-type well region 103, an Ni layer 1016 is formed thereafter to have a thickness of 60 nm, and heat treatment at 1000 degrees C. is executed to form the ohmic electrode 108. With this method, it is presumed that Al having a low melting point diffuses in Ni and precipitates on the surface thereof, reducing the surface energy of Ni and preventing Ni silicide from growing in stripes (agglomeration) for a uniform silicide layer to be formed.

Figure 24:
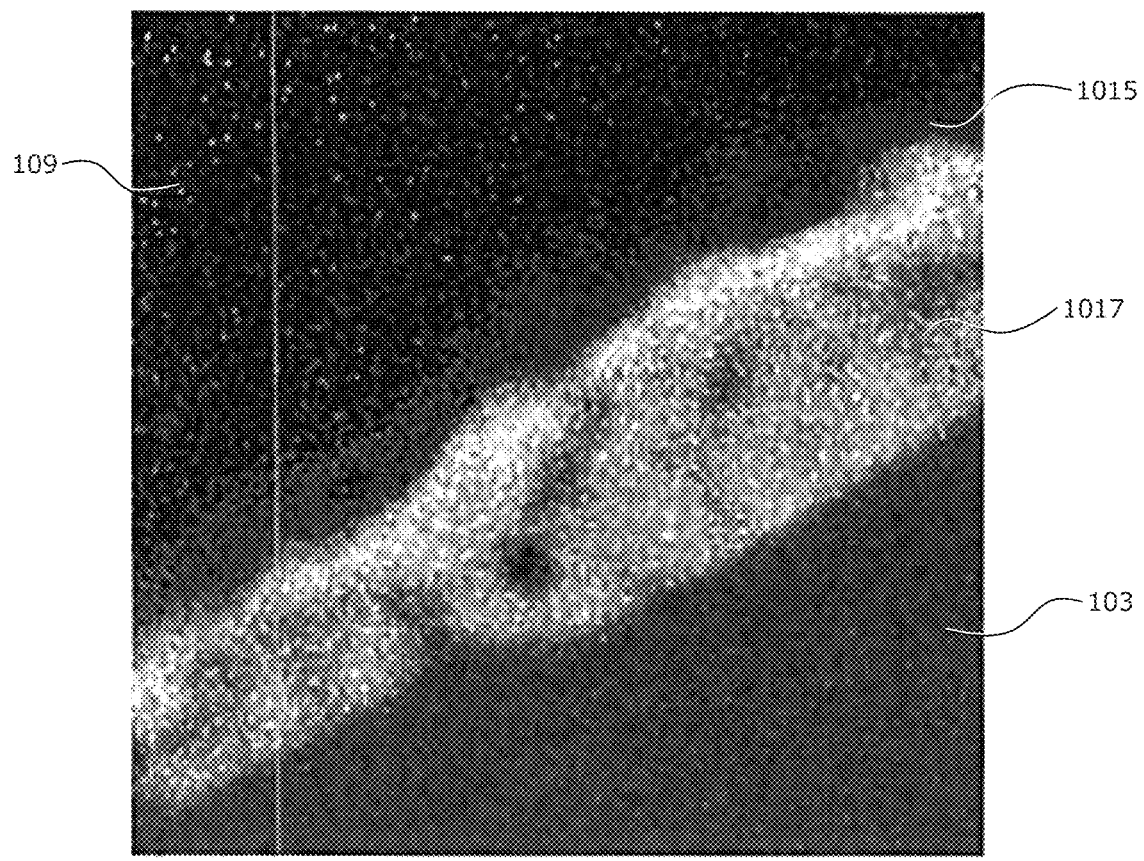
FIG. 24 is a cross-sectional view of the structure of an ohmic electrode of the silicon carbide diode that includes a conventional two-layer contact electrode.

FIG. 24 is a cross-sectional view of the structure of an ohmic electrode of the silicon carbide diode including the conventional two-layer contact electrode. FIG. 24 depicts a result obtained by performing heat treatment at about 1000 degrees C. As depicted in FIG. 24, the ohmic electrode 108 had the thick $Ni_2Si$ layer 1017 (the Ni silicide layer) uniformly formed on SiC, the Al layer 1015 was segregated on the surface, and the C layer was not formed on the surface. As a result, the forward property of the silicon carbide diode including the two-layer contact electrode had a resistance lower than that of the silicon carbide diode depicted in FIG. 20 including the Ni contact electrode.

Although many forms of Ni silicide such as $Ni_2Si$, NiSi, and $NiSi_2$ exist, the silicide that is most stable for SiC and that has the lowest resistance is $Ni_2Si$. FIG. 25 is a graph of Raman spectroscopy spectra obtained when the heat treatment temperature is 500 degrees C. to 1000 degrees C. In FIG. 25, the horizontal axis represents the Raman shift and the unit thereof is "$cm^{-1}$", and the vertical axis represents the scattering intensity. The Raman spectroscopic method is a technique of analyzing the structure at the molecular level using a Raman spectrum obtained by applying light to a material, and dispersing Raman-scattered light scattered to have a wavelength different from that of the incident light by molecular vibrations. The composition of the Ni silicide layer may be identified using the Raman spectroscopic method. FIG. 25 depicts the peak positions of the representative silicide forms of $Ni_2Si$, NiSi, and $NiSi_2$. From an analysis of the peaks in FIG. 25, it was found that $Ni_2Si$ is formed as the Ni silicide layer as a result of heat treatment at 700 degrees C. or higher. On the other hand, with heat treatment at 600 degrees C. or lower, the peak position shifted from that of $Ni_2Si$ and the intensity is low, and therefore, the formation of $Ni_2Si$ is incomplete. According to the result of the same experiment executed at a temperature up to 1200 degrees C., it was found that the main constituent of the silicide layer at temperatures up to 1200 degrees C. is $Ni_2Si$.

As described, when Al and Ni are deposited in this order on p-type SiC and heat treatment is performed at 700 degrees C. or higher, stable $Ni_2Si$ is formed and the precipitation of the C layer to the surface observed for the Ni layer as a single substance is not observed. As a result, an excellent forward property may be obtained in the evaluation of the element. With this method, however, the top surface has an Al-rich structure. For an actual element, for example, processes such as the formation of the Schottky electrode at about 500 degrees C. and heat treatment are executed after the formation of the silicide layer and as a result, problems such as the contamination of the heat treatment furnace by Al and the like arise during processing for this structure.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
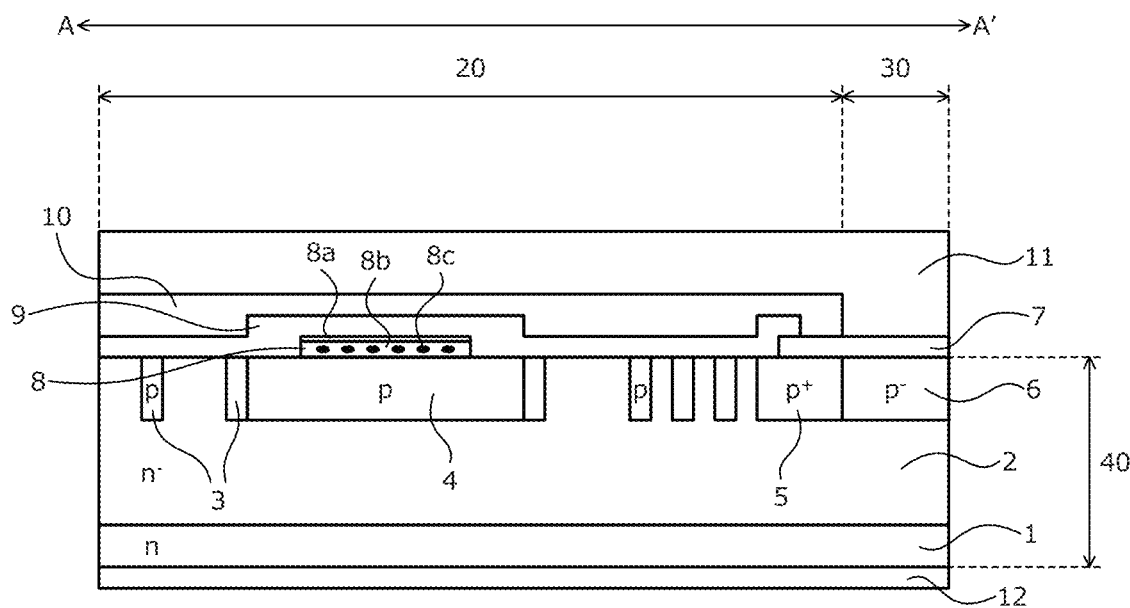
FIG. 1 is a cross-sectional view along cutting line A-A' in FIG. 2.
Figure 2:
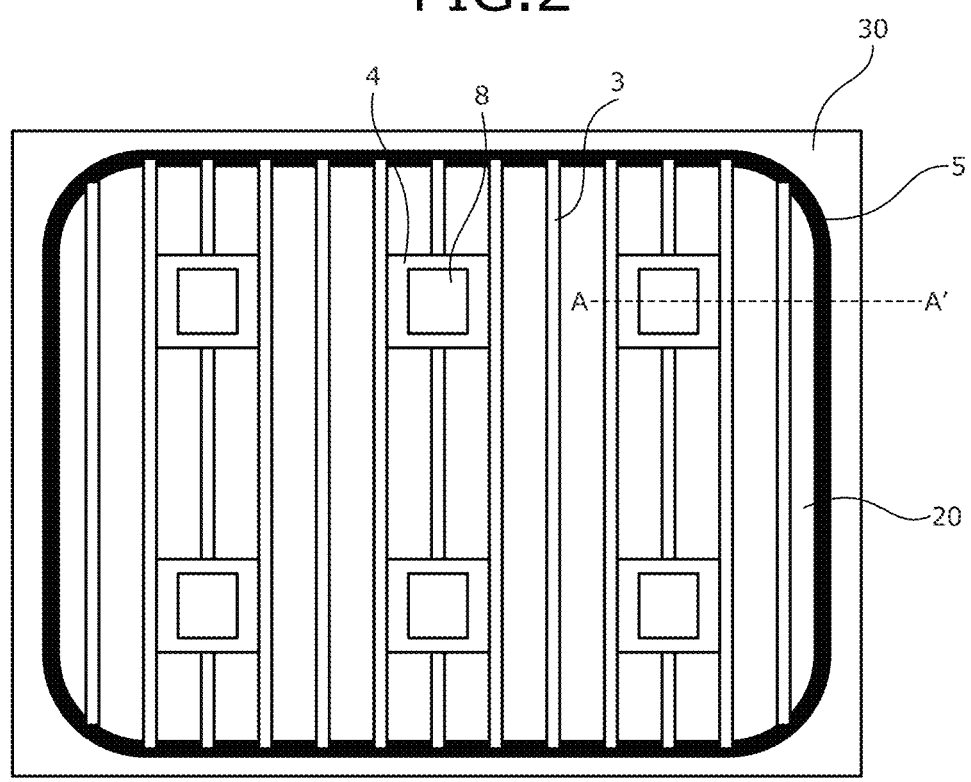
FIG. 2 is a top view of the structure of a silicon carbide semiconductor device according to an embodiment.

The semiconductor device according to the present invention is configured using a wide bandgap semiconductor. In the embodiment, a silicon carbide semiconductor device manufactured using, for example, SiC as the wide bandgap semiconductor will be described taking an SBD having a JBS structure as an example. FIG. 1 is a cross-sectional view along cutting line A-A' in FIG. 2, which depicts the structure of the silicon carbide semiconductor device according to the embodiment. FIG. 2 is a top view of the structure of the silicon carbide semiconductor device according to the embodiment.

As depicted in FIGS. 1 and 2, the silicon carbide semiconductor device according to the embodiment includes an active region 20 and an edge termination region 30 surrounding the circumference of the active region 20, in a semiconductor base substrate including silicon carbide (hereinafter, referred to as "silicon carbide base substrate (a semiconductor substrate (a semiconductor chip))") 40. The active region 20 is a region through which a current flows during the ON-state. The edge termination region 30 is a region that mitigates the electric field on the front surface side of the base substrate in a drift region to sustain the breakdown voltage.

The silicon carbide base substrate 40 is formed by stacking on the front surface of an n-type silicon carbide substrate (a silicon carbide semiconductor substrate of a first conductivity type) 1 containing silicon carbide, an $n^-$-type drift layer (a first semiconductor layer of the first conductivity type) 2 containing silicon carbide. In the active region 20, a p-type well region (a first semiconductor region of a second conductivity type) 3 and a p-type region (a second semiconductor region of the second conductivity type) 4 to be the JBS structure are selectively provided in the surface layer on a first side of the type drift layer 2 (the front surface side of the base substrate) opposite a second side of the $n^-$-type drift layer 2 facing the n-type silicon carbide base substrate 1. The p-type well region 3 is provided to contact the p-type region 4. On an outer side of the p-type well region 3 and the p-type region 4, one annular p⁺-type guard ring region 5 is arranged surrounding the active region 20 (see, for example, FIG. 2).

In the edge termination region 30, a p⁻-type junction termination extension (JTE) region 6 to improve the breakdown voltage of the high-voltage semiconductor device overall by mitigating or dispersing the electric field of the edge termination region 30 is selectively provided in the surface layer on the first side of the n⁻-type drift layer 2 (the front surface side of the base substrate). The JTE region 6 is provided to surround the p⁺-type guard ring region 5.

In a portion of the active region 20 on the front surface side of the silicon carbide base substrate 40, an ohmic electrode (a second electrode) 8 that forms an ohmic-contact with the p-type region 4, and a Schottky electrode (a first electrode) 9 that forms a Schottky-contact with the n⁻-type drift layer 2 and the p-type well region 3 are provided. A Ti—Al alloy layer 8a is provided on the surface of the ohmic electrode 8 (the surface in contact with the Schottky electrode 9). An Ni silicide layer 8b is provided in the ohmic electrode 8. Ti 8c is locally present inside the Ni silicide layer 8b. C not depicted is present at the same positions as those of Ti 8c inside the Ni silicide layer 8b. The Ni silicide layer 8b includes Ni₂Si as a main constituent. As described, in the embodiment, the surface of the ohmic electrode 8 is the Ti—Al alloy layer 8a, and C and Al do not precipitate thereon.

Here, a surface portion of the p-type region 4 in contact with the ohmic electrode 8 acts as an ohmic contact region (hereinafter, may simply be referred to as "contact region"). An upper electrode 10 covers the Schottky electrode 9, and a passivation film 11 containing polyimide is provided to protect the upper electrode 10 and an interlayer insulating film 7 described later. A lower electrode 12 is provided on a rear surface of the silicon carbide base substrate 40 (the rear surface of the n-type silicon carbide substrate 1).

The interlayer insulating film 7 covers the JTE region 6 of the edge termination region 30. The JTE region 6 of the edge termination region 30 is electrically insulated from the Schottky electrode 9 and the upper electrode 10 by the interlayer insulating film 7. An inner-side end portion of the interlayer insulating film 7 extends on the p⁺-type guard ring 5.

A method of manufacturing a silicon carbide semiconductor device according to the embodiment will be described. A method of manufacturing the SBD having the JBS structure in FIG. 1 will be described. FIGS. 3, 4, 5, 6, 7, and 8 are cross-sectional views of the silicon carbide semiconductor device according to the embodiment during manufacture. The n-type silicon carbide substrate 1 is first prepared. The n⁻-type drift layer 2 is formed on the front surface of the n-type silicon carbide substrate 1 by epitaxial growth.

In the active region 20, the p-type well region 3 and the p-type region 4 are each selectively formed in the surface layer of the n⁻-type drift layer 2 by photolithography and ion implantation of a p-type impurity. For example, the depth of the p-type well region 3 is about 0.8 µm. In the edge termination region 30, the p⁺-type guard ring region 5 and the JTE region 6 are each selectively formed in the surface layer of the n⁻-type drift layer 2 by photolithography and ion implantation of a p-type impurity. The order of the formation of the p-type well region 3 and the p-type region 4, and the formation of the p⁺-type guard ring region 5 and the JTE region 6 may be interchanged. After all ion implantation sessions are finished, activation annealing is performed.

Figure 3:
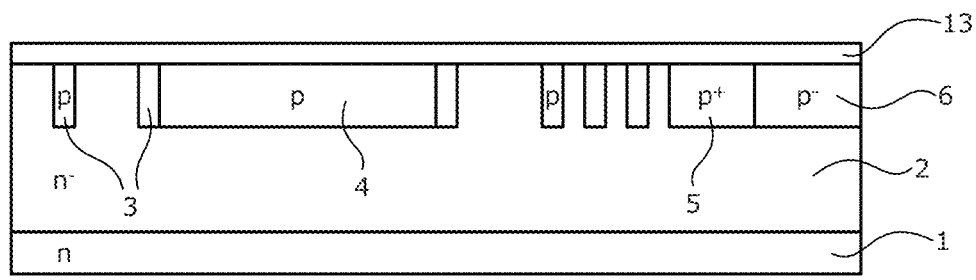
FIGS. 3, 4, 5, 6, 7, and 8 are cross-sectional views of the silicon carbide semiconductor device according to the embodiment during manufacture.
Figure 4:
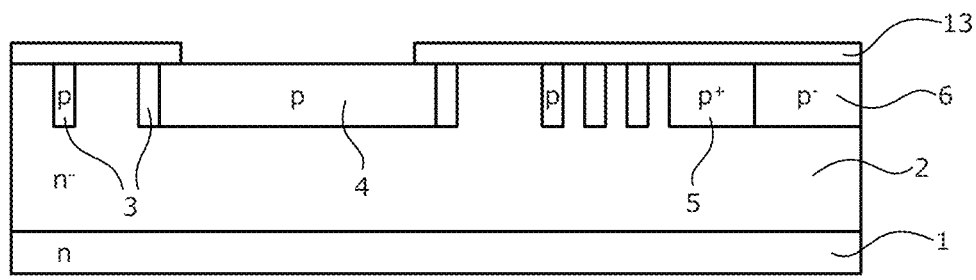

A field oxide film 13 to become the interlayer insulating film 7 is formed along the front surface of the silicon carbide base substrate and has a film thickness of, for example, 0.5 µm. The state established so far is depicted in FIG. 3. The oxide film is etched by a photoetching process to form a contact metal formation region on the p-type region 4. The state established so far is depicted in FIG. 4.

Figure 5:
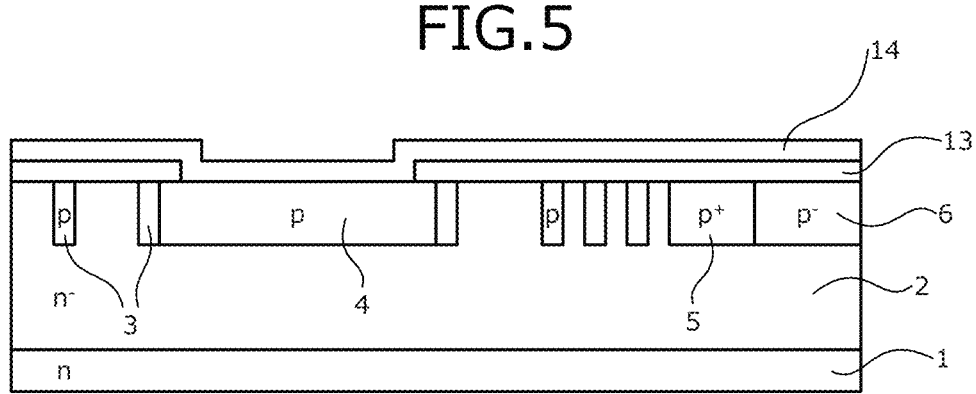
Figure 6:
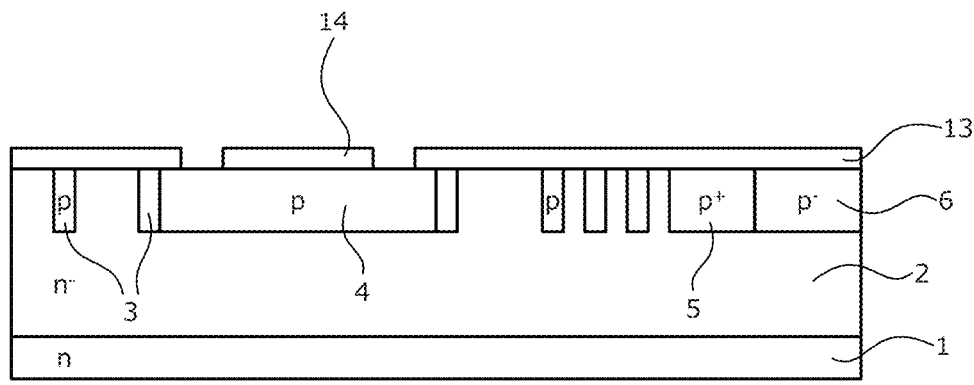

Al, Ni, and Ti are deposited in this order along the front surface of the silicon carbide base substrate, and a contact metal 14 is formed by a sputtering method. In this case, because the Al diffuses into the Ni and precipitates on the surface of the deposited Ni, an excessively thick layer is unsuitable and based on experimental results, the thickness of deposited Al may be 10 to 20 nm. When the thickness of the deposited Ni is excessively thin, no Ni contact is formed due to the effects of Al. Although no restriction is set for the upper limit, the thickness of deposited Ni may be 30 to 90 nm. Because Ti has to be alloyed with Al, the thickness of the deposited Ti has to be thicker than that of the deposited Al. Therefore, the thickness of Ti may be 30 to 60 nm. The state established so far is depicted in FIG. 5. The contact metal 14 is removed by etching, leaving a region on the p-type region 4, where the ohmic electrode 8 formed. The state established so far is depicted in FIG. 6.

Figure 7:
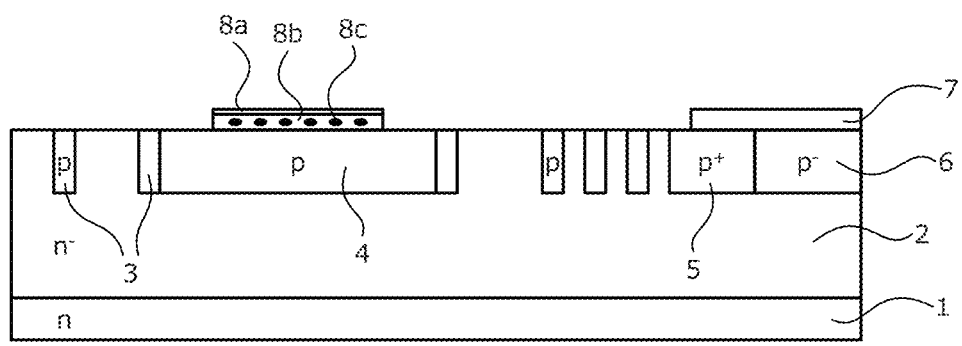

The ohmic electrode 8 is formed by a heat treatment (annealing) process executed for five minutes at a temperature of 900 degrees C. to 1100 degrees C. The atmosphere of the annealing may be argon (Ar) or nitrogen (N₂). The ohmic electrode 8 may be formed by laser annealing. In this case, because the overall device does not need to be placed in the furnace and the device is locally heated by the laser and therefore, the surface is not affected and the ohmic property is improved. In this manner, Al, Ni, and Ti are deposited in this order and the heat treated whereby the Al diffuses into the Ni and SiC, enabling a uniform silicide to be formed. The Al bonds with the Ti that is on the surface whereby the Ti—Al alloy layer 8a is formed. The execution of the heat treatment at the temperature of 900 degrees C. to 1100 degrees C. causes the main constituent of the Ni silicide layer 8b to be Ni₂Si, enabling a high ohmic property to be achieved. The field oxide film 13 is removed by etching, leaving a portion in the edge termination region 30. The field oxide film 13 remaining in the edge termination region 30 becomes the interlayer insulating film 7. The state established so far is depicted in FIG. 7.

Figure 8:
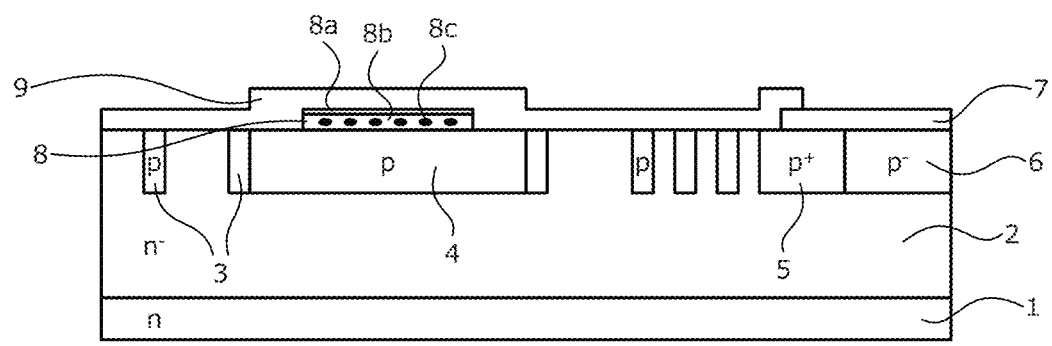

A Schottky metal is formed by sputtering Ti along the front surface of the silicon carbide base substrate to a thickness of 0.5 µm and the portion thereof outside the p⁺-type guard ring region 5 is removed by etching to form the Schottky electrode 9. The state established so far is depicted in FIG. 8.

Al—Si is formed as the upper electrode 10 to have a thickness of 5 µm and a portion of the Al—Si on the p⁺-type guard ring region 5 on the outer circumferential side of the Schottky electrode 9 is removed by etching. Polyimide is applied on the uppermost surface to form the passivation film 11.

A lower electrode 12 is formed on the rear surface of the n-type silicon carbide substrate 1. The silicon carbide semiconductor device depicted in FIG. 1 is thereby manufactured.

Figure 9:
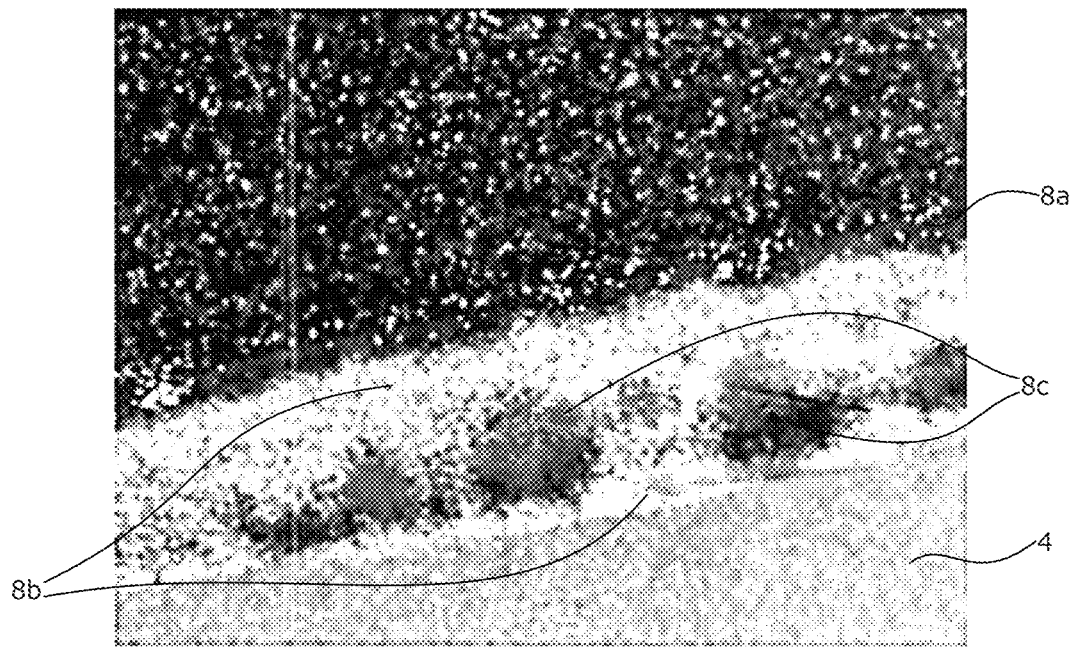
FIG. 9 is a cross-sectional view of the structure of an ohmic electrode of the silicon carbide semiconductor device according to the embodiment.

The structure of the ohmic electrode will be described in detail on the basis of the ohmic electrode manufactured using the method of the embodiment. FIG. 9 is a cross-sectional view of the structure of the ohmic electrode of the silicon carbide semiconductor device according to the embodiment. FIG. 9 depicts an observation result of a cross-section of the ohmic electrode 8 formed by depositing Al, Ni, and Ti in this order on the p-type region 4 and executing heat treatment at 1000 degrees C. As depicted in FIG. 9, the Ti—Al alloy layer 8a was formed on the surface of the ohmic electrode 8 and the Ni silicide layer 8b was formed therein. In the Ni silicide layer 8b, Ni$_2$Si formed favorably similar to a case where Al and Ni are deposited. The Ti—Al alloy layer 8a was thermally stable and Al did not diffuse therein; and there were no problems in the heat treatment processing executed thereafter. The Ti 8c was locally present inside the Ni silicide layer 8b.

The results of analysis of the elements in the ohmic electrode 8 by energy dispersive X-ray spectrometry (EDX) will be described. EDX is a technique of examining the elements constituting an object and their concentrations from the energy of each and the number of the electron-hole pairs generated by introducing into a semiconductor detector, characteristic X rays generated when a primary ray such as an electron beam or an X-ray is applied to the object.

Figure 10A:
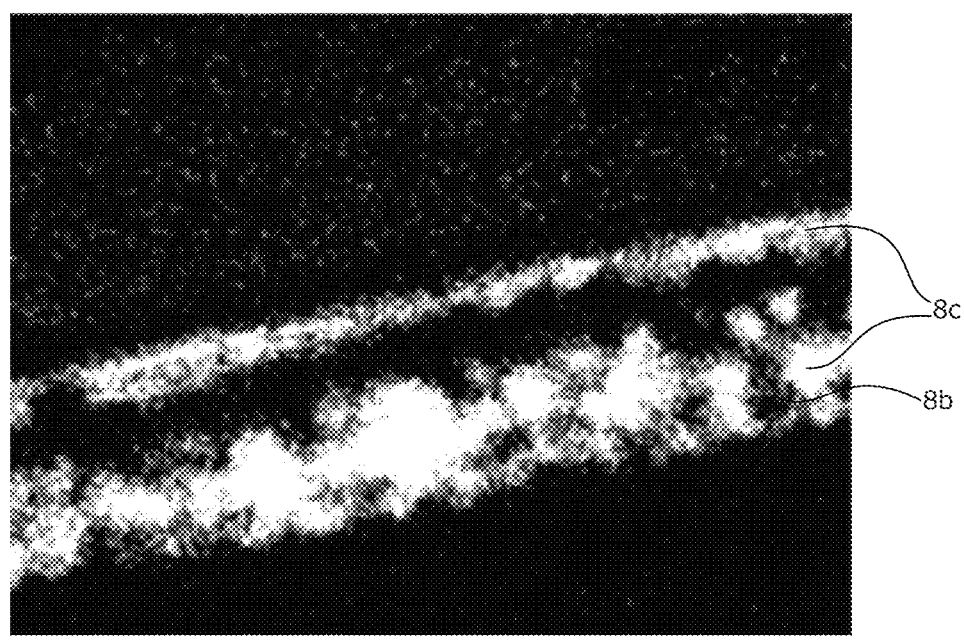
FIG. 10A is a cross-sectional view of Ti distribution in the ohmic electrode according to the embodiment.
Figure 10B:
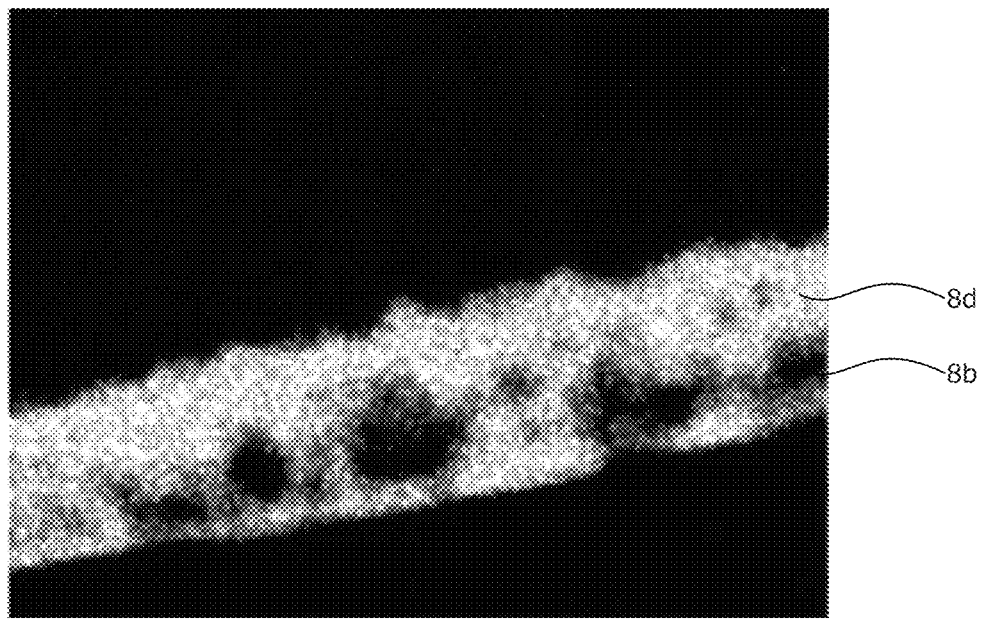
FIG. 10B is a cross-sectional view of Ni distribution in the ohmic electrode according to the embodiment.

FIG. 10A is a cross-sectional view of Ti distribution in the ohmic electrode according to the embodiment. As depicted in FIG. 10A, the Ti 8c was locally present in the Ni silicide layer 8b in addition to the portion thereof that formed an alloy with Al on the top surface. FIG. 10B is a cross-sectional view of Ni distribution in the ohmic electrode according to the embodiment. As depicted in FIG. 10B, Ni 8d was present in the Ni silicide layer 8b as a silicide.

Figure 10C:
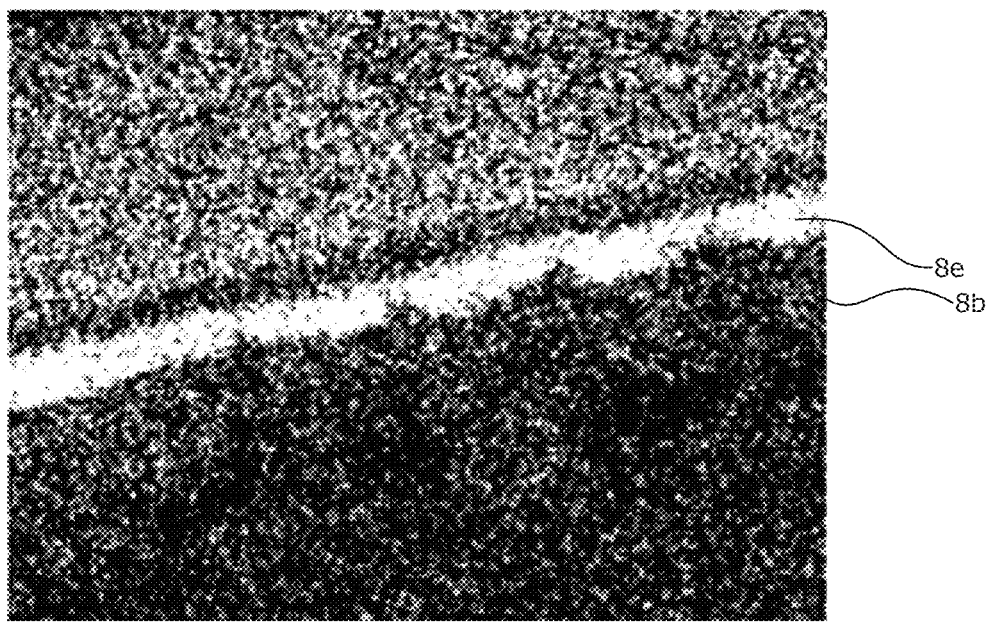
FIG. 10C is a cross-sectional view of Al distribution in the ohmic electrode according to the embodiment.

FIG. 10C is a cross-sectional view of Al distribution in the ohmic electrode according to the embodiment. Although Al 8e tended to precipitate on the surface, the Al 8e formed an alloy with the Ti 8c and as depicted in FIG. 10C, Al alone therefore did not precipitate on the surface and was locally present in the Ni silicide layer 8b.

Figure 10D:
FIG. 10D is a cross-sectional view of C distribution in the ohmic electrode according to the embodiment.

FIG. 10D is a cross-sectional view of C distribution in the ohmic electrode according to the embodiment. As depicted in FIG. 10D, although C precipitates on the surface in a conventional example where the ohmic electrode includes Ni alone, it is presumed that C 8f bonded with, i.e., formed an alloy with the Ti 8c or the Al 8e in a practical example, preventing precipitation on the surface. From FIG. 10A and FIG. 10D, it is presumed that, in the Ni silicide layer 8b, the Ti 8c and the C 8f were present at substantially a same position and the Ti 8c was bonded with the C 8f.

Figure 11A:
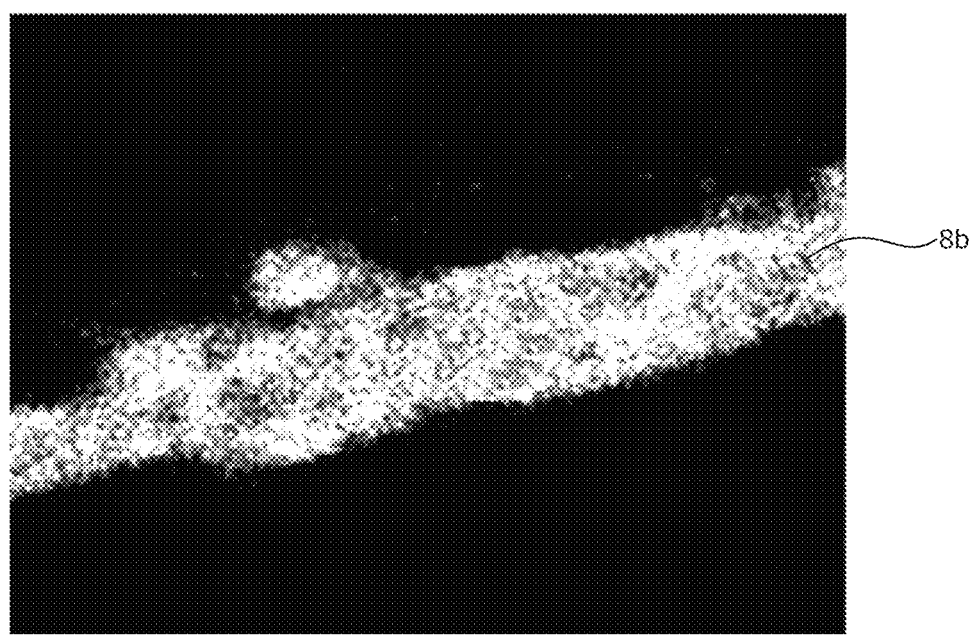
FIG. 11A is a cross-sectional view of Ni distribution in the ohmic electrode for which heat treatment was executed at 800 degrees C.
Figure 11B:
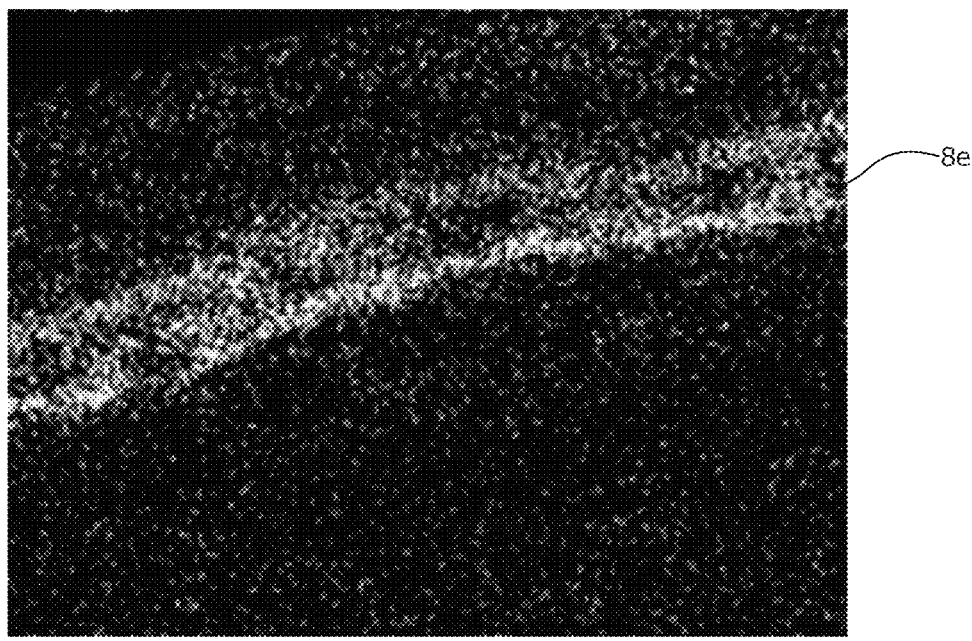
FIG. 11B is a cross-sectional view of Al distribution in the ohmic electrode for which the heat treatment was executed at 800 degrees C.
Figure 11C:
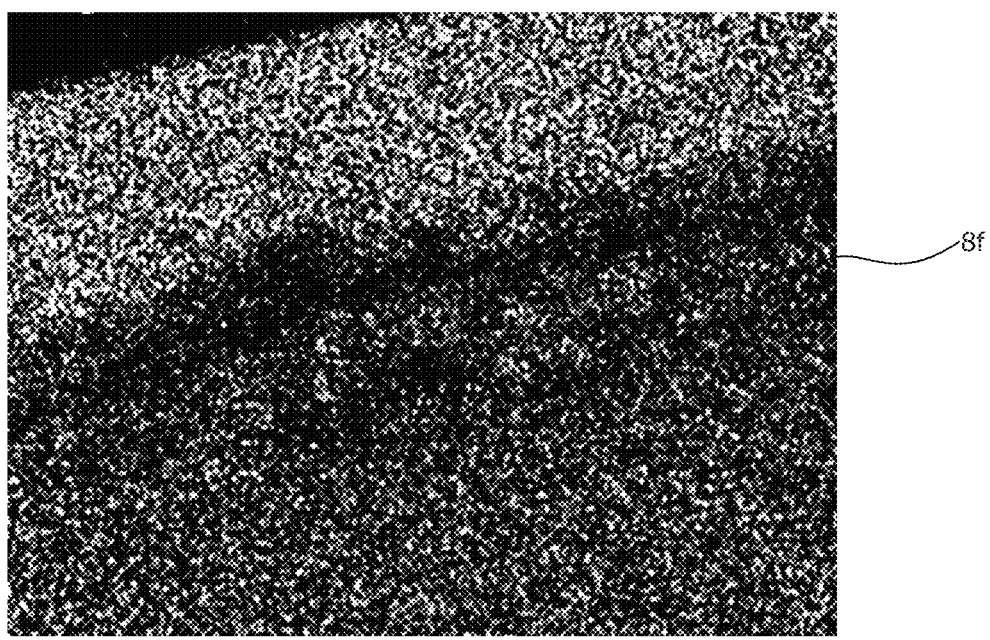
FIG. 11C is a cross-sectional view of C distribution in the ohmic electrode for which the heat treatment was executed at 800 degrees C.
Figure 11D:
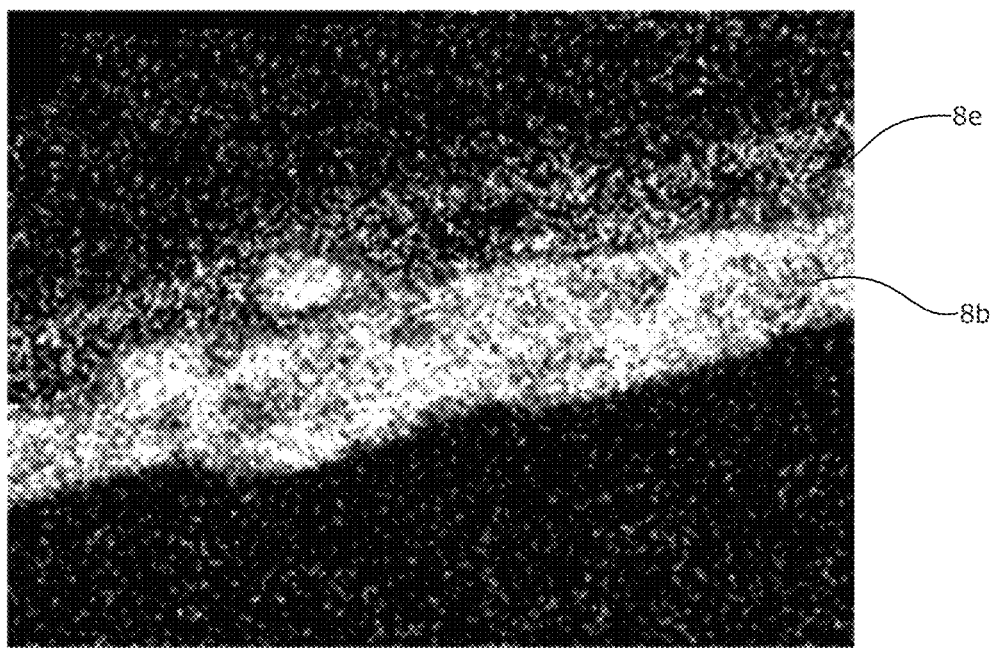
FIG. 11D is a cross-sectional view of Al—Ni distribution in the ohmic electrode for which the heat treatment was executed at 800 degrees C.

Differences in the configuration of the ohmic electrode 8 between annealing temperatures will be described. A case where the heat treatment was executed at 800 degrees C. for the same configuration will be described. FIG. 11A is a cross-sectional view of Ni distribution in the ohmic electrode for which heat treatment was executed at 800 degrees C. FIG. 11B is a cross-sectional view of Al distribution in the ohmic electrode for which heat treatment was executed at 800 degrees C. FIG. 11C is a cross-sectional view of C distribution in the ohmic electrode for which heat treatment was executed at 800 degrees C. FIG. 11D is a cross-sectional view of Al—Ni distribution in the ohmic electrode for which heat treatment was executed at 800 degrees C.

As depicted in FIG. 11D, compared to the case in FIG. 9 where the heat treatment was executed at 1000 degrees C., the Al 8e precipitated on the surface of the Ni silicide layer 8b. As a result, even in the case where Al, Ni, and Ti were deposited in this order, when the heat treatment was executed at 800 degrees C., because Al was present on the surface, Al scattered during the heat treatment processing executed thereafter and caused problems.

Figure 12A:
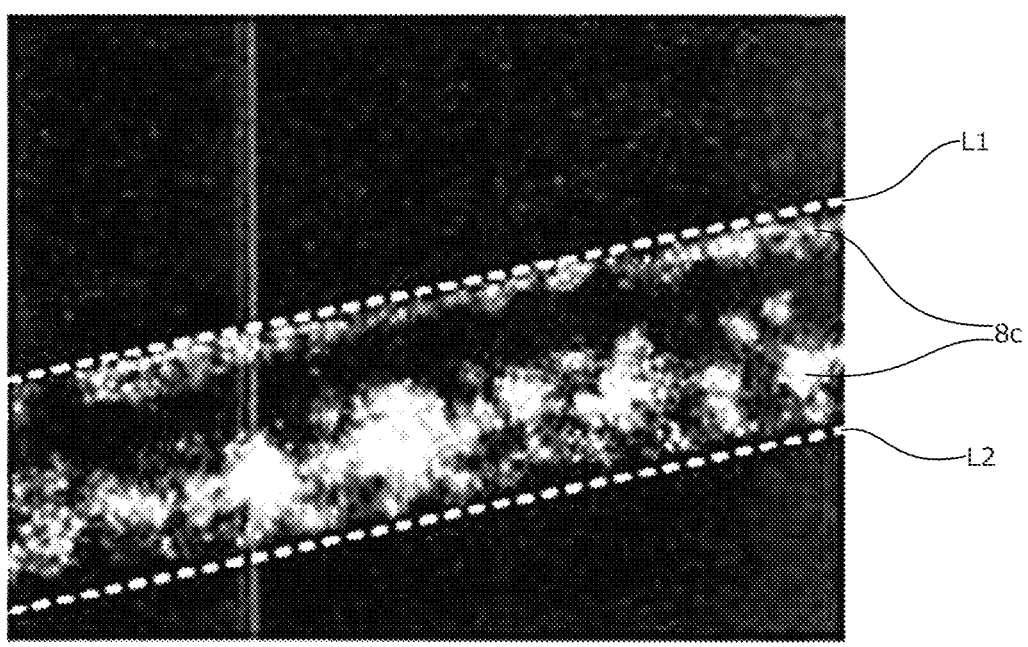
FIG. 12A is a cross-sectional view of the structure of the ohmic electrode for which the heat treatment was executed at 1000 degrees C.
Figure 12B:
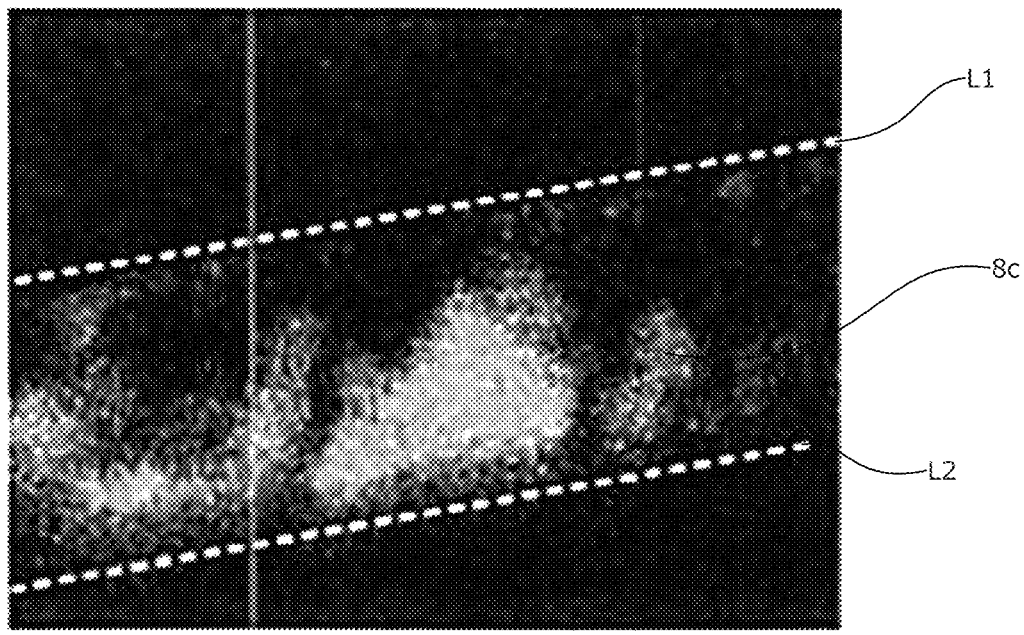
FIG. 12B is a cross-sectional view of the structure of the ohmic electrode for which the heat treatment was executed at 1100 degrees C.
Figure 12C:
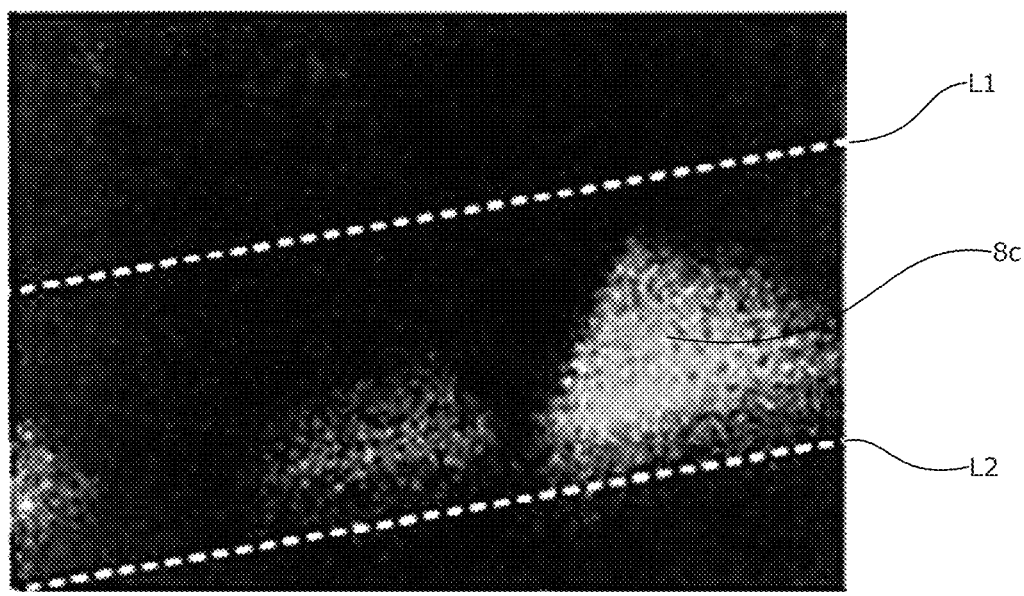
FIG. 12C is a cross-sectional view of the structure of the ohmic electrode for which the heat treatment was executed at 1200 degrees C.

Cases will be described where heat treatment was executed for the ohmic electrode 8 having the same configuration at 1000 degrees C., 1100 degrees C., and 1200 degrees C. FIG. 12A is a cross-sectional view of the structure of the ohmic electrode for which the heat treatment was executed at 1000 degrees C. FIG. 12B is a cross-sectional view of the structure of the ohmic electrode for which the heat treatment was executed at 1100 degrees C. FIG. 12C is a cross-sectional view of the structure of the ohmic electrode for which the heat treatment was executed at 1200 degrees C. In FIGS. 12A to 12C, a dotted line L1 indicates the upper end of the Ni silicide layer 8b, i.e., the portion thereof in contact with the Schottky electrode 9 (the surface). A dotted line L2 indicates the lower end of the Ni silicide layer 8b, i.e., the portion thereof in contact with the p-type well region 3.

As described, for 1000 degrees C., as depicted in FIG. 12A, the Ti 8c was present at the upper end of the Ni silicide layer 8b and formed an alloy with Al to form the Ti—Al alloy 8a. In contrast, as depicted in FIG. 12B and FIG. 12C, the Ti 8c at the upper end L1 of the Ni silicide layer 8b decreased and tended to segregate inside the Ni silicide layer 8b accompanying the increased heat treatment temperatures of 1100 degrees C. and 1200 degrees C. The Ti 8c on the surface decreased non-uniformly for 1100 degrees C. or higher, and the Ti 8c substantially disappeared from the surface for 1200 degrees C. The Al 8e also precipitated on the surface for 1000 degrees C. while the Al 8e tended to be distributed in the overall film with higher temperatures of 1100 degrees C. or higher. Although not depicted, it is recognized that C segregated on the surface in the case of the heat treatment executed at 1200 degrees C.

Therefore, in cases where Al, Ni, and Ti were deposited in this order, it is conceivable that the upper limit of the heat treatment was 1100 degrees C., taking into consideration the importance of the surface being covered by the Al—Ti alloy 8a and no C precipitation layer being present on the surface.

Figure 13A:
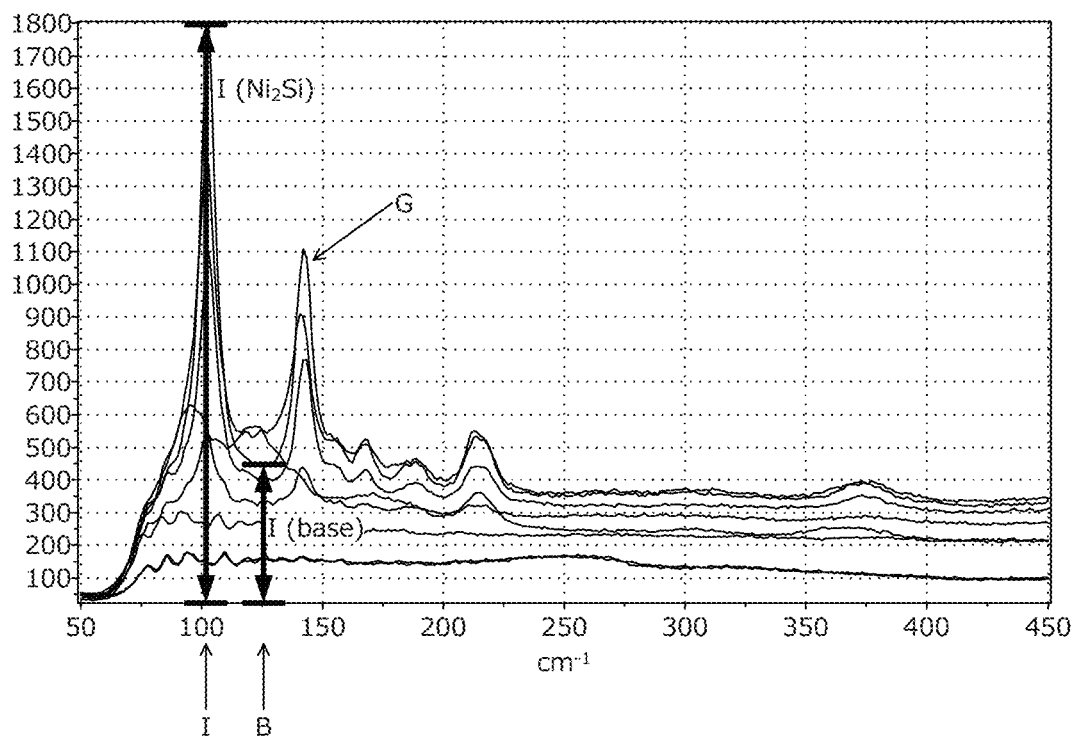
FIG. 13A is a graph of Raman scattering light intensities near a Raman shift of 102 $cm^{-1}$ for $Ni_2Si$, NiSi, and $NiSi_2$ Ni.

The result of the measurement of Raman spectroscopy spectra of the ohmic electrode of the embodiment will be described. FIG. 13A is a graph of the Raman scattering light intensities of types of Ni silicide whose heat treatment temperatures were 500 degrees C. to 1000 degrees C., such as Ni$_2$Si, NiSi, and NiSi$_2$. In FIG. 13A, the horizontal axis represents the Raman shift and the unit thereof is "cm$^{-1}$" and the vertical axis represents the scattering intensity. Because the Raman scattering light intensity corresponds to the amount (the volume) of the silicide, it can be seen that a large amount of Ni$_2$Si was included since the Raman scattering light intensity was high.

The heat treatment temperature for forming the ohmic electrode 8 was varied and the peak intensity and the base intensity to be the hem, of Ni$_2$Si for each of the heat treatment temperatures were determined.

Figure 13B:
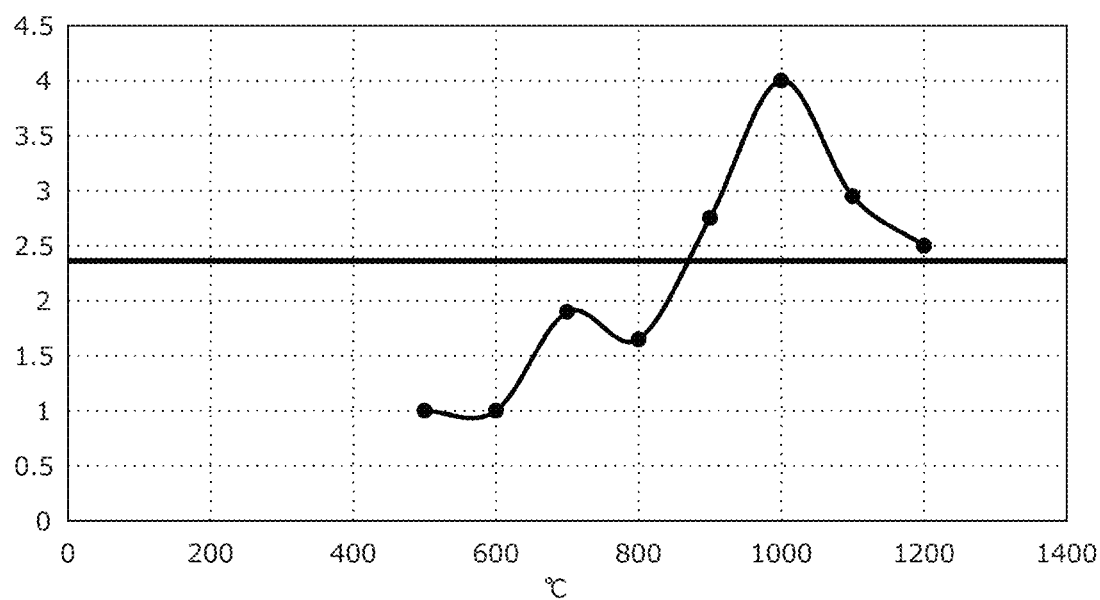
FIG. 13B is a graph of peak intensity normalized by base intensity, near a Raman shift of 102 $cm^{-1}$ for each heat treatment temperature.

FIG. 13B is a graph of the peak intensity normalized by the base intensity, near a Raman shift of 102 cm$^{-1}$ for each of the heat treatment temperatures. In FIG. 13B, the horizontal axis represents the heat treatment temperature and the unit thereof is "degrees C." and the vertical axis represents the peak intensity/the base intensity. As depicted in FIG. 13A, although the Raman scattering peak is divided into two even when the peak is the one related to Ni$_2$Si, any one thereof is taken for consideration.

As depicted in FIG. 13B, the peak intensity/the base intensity increased as the heat treatment temperature increased from 500 degrees C., and reached a peak at 1000 degrees C. According to another experiment, the peak intensity/the base intensity tended to decrease at heat treatment temperatures of 1000 degrees C. or higher. When the peak intensity of Ni2Si was about 60% of that at the peak temperature of 1000 degrees C., this ratio was sufficient as the ratio of Ni$_2$Si and therefore, the heat treatment temperature only had to be 900 degrees C. or higher. When the same operation was executed for the peak for NiSi, the ratio thereof did not depend on the heat treatment temperature.

As described, at 1200 degrees C., the Ti 8c diffused inside and substantially no segregation on the surface was observed and therefore, the Ti—Al alloy layer 8a was not formed. As a result, a temperature from 900 degrees C. to 1100 degrees C. was the optimal heat treatment temperature from the viewpoint of the formation of $Ni_2Si$ and the Ti segregation on the surface.

Figure 14:
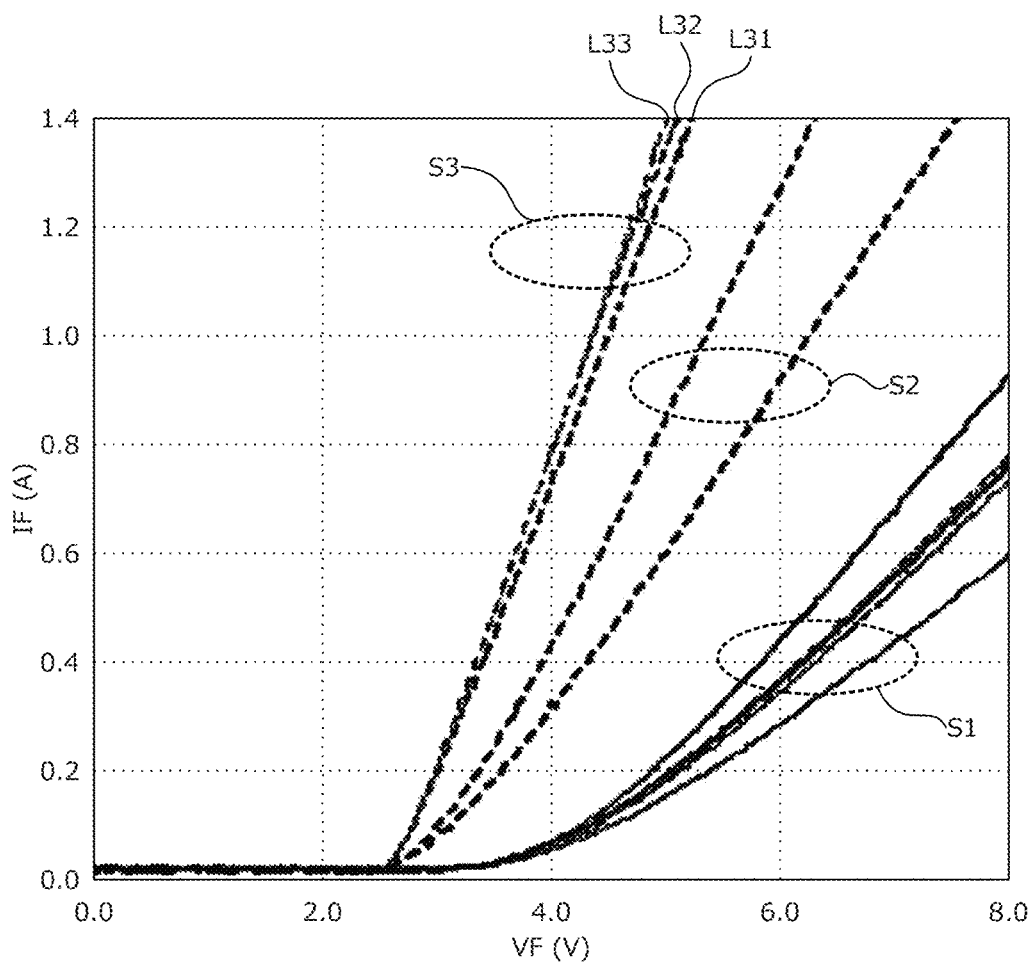
FIG. 14 is a graph of a comparison of the forward property among the ohmic electrodes of the embodiment and the conventional technique.

FIG. 14 is a graph of a comparison of the forward property among the ohmic electrodes of the embodiment and the conventional technique. In FIG. 14, the horizontal axis represents the forward current and the unit thereof is "A", and the vertical axis represents the forward voltage and the unit thereof is "V". The graph presents the results of an experiment executed applying the ohmic electrodes of the embodiment and the conventional technique to a silicon carbide pn-diode. The graph presents the results of the forward property obtained by wafer probing for the state of a wafer. The built-in voltage of the silicon carbide pn-diode was about 2.6V.

Figure 16:
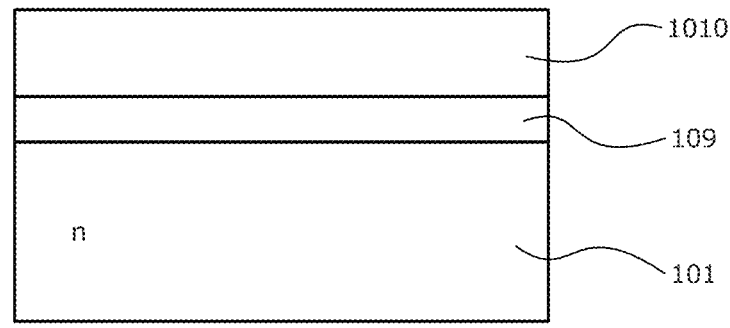
FIG. 16 is a cross-sectional view along cutting line A-A' in FIG. 17.
Figure 17:
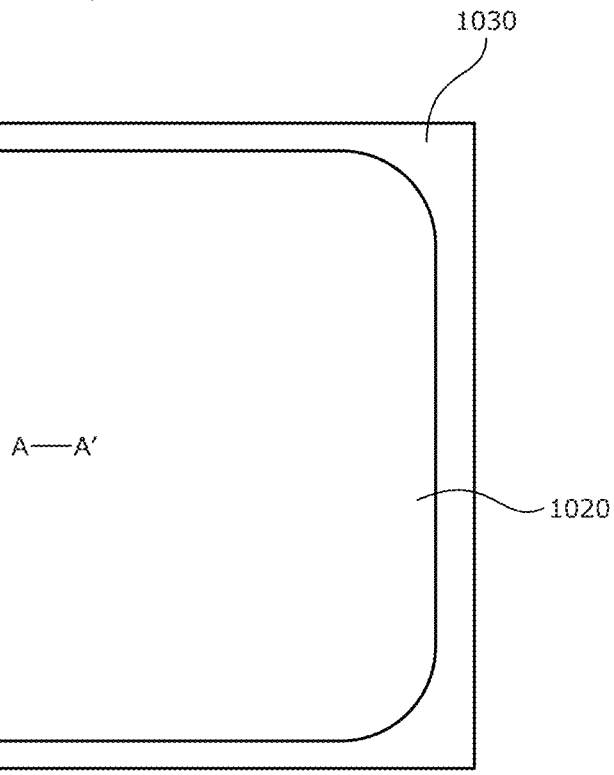
FIG. 17 is a top view of the structure of a conventional silicon carbide diode.

In FIG. 14, a reference character "S1" denotes the results for the conventional silicon carbide diodes without a contact layer and depicted in FIG. 16. These results represent the measurement results of plural silicon carbide diodes for which the heat treatment was executed at the same temperature. As depicted in FIG. 14, for the diodes without the contact layer, the results show that the operation resistance was high and the VF (the forward voltage) was high. The variation due to individual differences was significant even with the same heat treatment temperature.

In FIG. 14, a reference character "S2" denotes the results for the conventional silicon carbide diodes with the contact layer formed by a single Ni layer and depicted in FIG. 20. These results represent the measurement results of plural silicon carbide diodes for which the heat treatment was executed at the same temperature. As depicted in FIG. 14, with the Ni single layer, although the property was improved as compared to that of the diode including no contact layer, the variation was high due to temperature differences during the heat treatment. It is conceivable that this was the result of the non-uniformity of the Ni silicide layer and the precipitation of the C film. In addition, due to the effects of the C film, the Ni silicide layer had degraded adhesiveness with respect to the upper electrode and the manufacture thereof (the wire bonding) was impossible.

In FIG. 14, a reference character "S3" denotes the results for the silicon carbide diodes of the practical example according to the present invention and in which Al, Ni, and Ti were deposited in this order as depicted in FIG. 1. These results represent the results of a case where the heat treatment was executed at 1000 degrees C., 1100 degrees C., and 1200 degrees C. "L31" represents the results for 1000 degrees C., "L32" represents the results for 1100 degrees C., and "L33" represents the results for 1200 degrees C. As depicted in FIG. 14, the operation resistance mildly decreased and the VF decreased as the temperature increased. The upper limit of the practical heat treatment temperature was however 1100 degrees C. because C segregates on the surface at 1200 degrees C.

Figure 15:
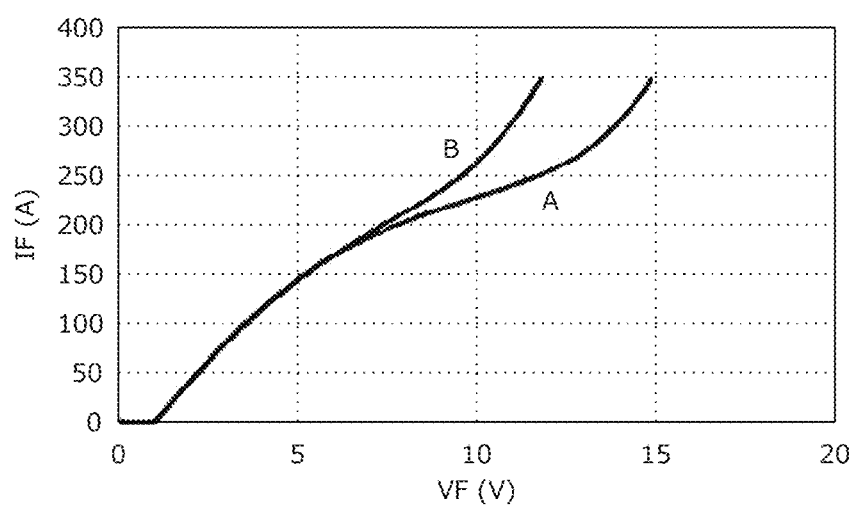
FIG. 15 is a graph of a comparison of a forward property of a silicon carbide diode between the embodiment and a conventional technique.

FIG. 15 is a graph of a comparison of the forward property of the silicon carbide diode between the embodiment and the conventional technique. In FIG. 15, the vertical axis represents the forward current and the unit thereof is "A" and the horizontal axis represents the forward voltage and the unit thereof is "V". "A" in FIG. 15 denotes the property of the silicon carbide diode having the conventional JBS structure depicted in FIG. 18, and "B" in FIG. 15 denotes the property of the silicon carbide diode of the practical example according to the present invention.

The curves A and B in FIG. 15 result in a curve that indicates a combined current of the current flowing through the Schottky electrode 9 and the current flowing through the p-type well region 3. B, which indicates the current including the current flowing through the ohmic electrode 8, has a low rise voltage on the high current side. The rise waveform of B may be further shifted toward the constant-voltage side by optimizing the spread of the current through the ohmic electrode 8. High power of the current×the voltage may be applied and the forward surge capability is increased by reducing the rise voltage.

As described, according to the silicon carbide semiconductor device of the embodiment, the Ti—Al alloy layer is provided on the upper surface of the ohmic electrode and the Ni silicide layer is provided inside the ohmic electrode. Ti is locally present inside the Ni silicide layer. The Ti—Al alloy layer is thermally stable and causes no contamination of the device, etc. by Al during processing. Because C does not precipitate on the surface, the Ti—Al alloy layer has excellent adhesiveness with respect to the upper electrode. Because C is not formed on the surface, the Ti—Al alloy layer has a high ohmic property. In addition, execution of the heat treatment at a temperature of 900 degrees C. to 1100 degrees C. causes $Ni_2Si$ to become the main constituent of the Ni silicide layer, enabling the Ni silicide layer to have a high ohmic property. As a result, regarding the forward property of the silicon carbide diode, the silicon carbide diode has lower resistance than that of the conventional silicon carbide diode and the forward surge capability may be improved.

Various changes can be made to the present invention within a scope not departing from the spirit of the present invention and in the embodiment, for example, dimensions, impurity concentrations, and the like of the components are variously set in accordance with required specifications and the like. In the embodiment, although description has been given taking the SBD as an example, the present invention is not limited hereto and is widely applicable to various silicon carbide semiconductor devices having an ohmic junction. For example, the present invention is applicable to a source electrode of a MOSFET. In the embodiment, although the first conductivity type is regarded to be an n-type and the second conductivity type is regarded to be a p-type, the present invention is similarly implemented when the first conductivity type is a p-type and the second conductivity type is an n-type.

According to the semiconductor device and the method of manufacturing a semiconductor device of the present invention, effects are achieved that the device is not contaminated, etc. during the processing, that the adhesiveness with respect to the upper electrode is excellent, that an excellent ohmic property for p-type SiC is retained, and that forward surge capability can be improved.

As described, the semiconductor device and the method of manufacturing a semiconductor device according to the present invention are useful for, for example, high-voltage power semiconductor devices used in power converting equipment and power supply devices such as in various industrial machines, and are particularly suitable for silicon carbide semiconductor devices having an ohmic junction.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type;
a first semiconductor layer of the first conductivity type provided on a front surface of the silicon carbide semiconductor substrate;
a first semiconductor region of a second conductivity type selectively provided in a surface of the first semiconductor layer;
a second semiconductor region of the second conductivity type selectively provided in the surface of the first semiconductor layer, the second semiconductor region being connected to the first semiconductor region;
a first electrode forming a Schottky-contact with the first semiconductor layer and the first semiconductor region; and
a second electrode forming an ohmic contact with the second semiconductor region and including a nickel silicide layer having a main constituent that is $Ni_2Si$ and containing titanium dispersed in the nickel silicide layer; and a titanium-aluminum alloy layer provided on the nickel silicide layer as a surface of the second electrode that contacts the first electrode.

2. The silicon carbide semiconductor device according to claim 1, wherein the second electrode includes carbon locally present at a position in the nickel silicide layer that is substantially the same position as that of the titanium included in the nickel silicide layer.

3. A method of manufacturing a semiconductor device, comprising:
preparing a silicon carbide semiconductor substrate of a first conductivity type;
forming a first semiconductor layer of the first conductivity type on a front surface of the silicon carbide semiconductor substrate;
selectively forming a first semiconductor region of a second conductivity type on a surface of the first semiconductor layer;
selectively forming a second semiconductor region of the second conductivity type on the surface of the first semiconductor layer, the second semiconductor region being connected to the first semiconductor region;
forming a first electrode that forms a Schottky-contact with the first semiconductor layer and the first semiconductor region; and
forming a second electrode that forms an ohmic-contact with the second semiconductor region by:
depositing aluminum, nickel, and titanium in this order; and
heat treating the deposited aluminum, nickel, and titanium to provide a nickel silicide layer having a main constituent that is $Ni_2Si$ and containing titanium dispersed in the nickel silicide layer; and a titanium-aluminum alloy layer provided on the nickel silicide layer as a surface of the second electrode that contacts the first electrode.

4. The method according to claim 3, wherein the heat treating is executed at 900 degrees C. to 1100 degrees C.

5. The method according to claim 3, wherein the aluminum is deposited to have a thickness of 10 to 20 nm, the nickel is deposited to have a thickness of 30 to 90 nm, and the titanium is deposited to have a thickness of 30 to 60 nm.

* * * * *